(12) United States Patent
Godo et al.

(10) Patent No.: US 12,336,224 B2
(45) Date of Patent: Jun. 17, 2025

(54) SEMICONDUCTOR DEVICE AND METHOD FOR MANUFACTURING THE SAME

(71) Applicant: SEMICONDUCTOR ENERGY LABORATORY CO., LTD., Atsugi (JP)

(72) Inventors: Hiromichi Godo, Kanagawa (JP); Tetsuhiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 136 days.

(21) Appl. No.: 17/830,620

(22) Filed: Jun. 2, 2022

(65) Prior Publication Data

US 2022/0302314 A1 Sep. 22, 2022

Related U.S. Application Data

(60) Continuation of application No. 16/038,515, filed on Jul. 18, 2018, now abandoned, which is a
(Continued)

(30) Foreign Application Priority Data

Nov. 25, 2011 (JP) .................................. 2011-257487

(51) Int. Cl.
*H10D 30/67* (2025.01)
*H01L 21/02* (2006.01)

(52) U.S. Cl.
CPC ..... *H10D 30/6755* (2025.01); *H10D 30/6739* (2025.01); *H01L 21/02554* (2013.01); *H01L 21/02565* (2013.01)

(58) Field of Classification Search
CPC ......... H01L 21/02554; H01L 21/02565; H01L 29/4908; H01L 29/7869; H01L 21/36;
(Continued)

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

CN 001540731 A 10/2004
CN 102208452 A 10/2011
(Continued)

OTHER PUBLICATIONS

Jacob.K et al., "Solid-State Cells with Buffer Electrodes for the Measurement of Thermodynamic Properties of IrO2, CaIrO3, Ca2IrO4, and Ca4IrO6", J. Electrochem. Soc. (Journal of the Electrochemical Society), Jan. 19, 1999, vol. 146, No. 5, pp. 1854-1861.
(Continued)

*Primary Examiner* — Meiya Li
(74) *Attorney, Agent, or Firm* — NIXON PEABODY LLP; Jeffrey L. Costellia

(57) ABSTRACT

To reduce oxygen vacancies in an oxide semiconductor film and the vicinity of the oxide semiconductor film and to improve electric characteristics of a transistor including the oxide semiconductor film. A semiconductor device includes a gate electrode whose Gibbs free energy for oxidation is higher than that of a gate insulating film. In a region where the gate electrode is in contact with the gate insulating film, oxygen moves from the gate electrode to the gate insulating film, which is caused because the gate electrode has higher Gibbs free energy for oxidation than the gate insulating film. The oxygen passes through the gate insulating film and is supplied to the oxide semiconductor film in contact with the gate insulating film, whereby oxygen vacancies in the oxide semiconductor film and the vicinity of the oxide semiconductor film can be reduced.

22 Claims, 21 Drawing Sheets

Related U.S. Application Data continuation of application No. 14/620,403, filed on Feb. 12, 2015, now abandoned, which is a division of application No. 13/674,175, filed on Nov. 12, 2012, now Pat. No. 8,962,386.

(58) Field of Classification Search
CPC ............ H10D 30/6739; H10D 30/6755; H10F 10/142
See application file for complete search history.

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,573,168 B2 | 6/2003 | Kim et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,247,562 B2 | 7/2007 | Ishikawa |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,378,286 B2 | 5/2008 | Hsu et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,465,674 B2 | 12/2008 | Tamura et al. |
| 7,468,304 B2 | 12/2008 | Kaji et al. |
| 7,501,293 B2 | 3/2009 | Ito et al. |
| 7,547,866 B2 | 6/2009 | Tanaka et al. |
| 7,674,650 B2 | 3/2010 | Akimoto et al. |
| 7,732,819 B2 | 6/2010 | Akimoto et al. |
| 7,777,210 B2 | 8/2010 | Tanaka et al. |
| 8,022,380 B2 | 9/2011 | Tanaka et al. |
| 8,049,225 B2 | 11/2011 | Yamazaki et al. |
| 8,089,117 B2 | 1/2012 | Shimizu |
| 8,110,436 B2 | 2/2012 | Hayashi et al. |
| 8,198,680 B2 | 6/2012 | Ishikawa |
| 8,304,300 B2 | 11/2012 | Sakata et al. |
| 8,324,626 B2 | 12/2012 | Kimura et al. |
| 8,354,674 B2 | 1/2013 | Kimura |
| 8,384,076 B2 | 2/2013 | Park et al. |
| 8,384,085 B2 | 2/2013 | Kimura et al. |
| 8,502,216 B2 | 8/2013 | Akimoto et al. |
| 8,507,907 B2 | 8/2013 | Takahashi et al. |
| 8,546,811 B2 | 10/2013 | Godo et al. |
| 8,581,247 B2 | 11/2013 | Suzuki et al. |
| 8,629,432 B2 | 1/2014 | Sakata et al. |
| 8,641,930 B2 | 2/2014 | Yano et al. |
| 8,680,679 B2 | 3/2014 | Godo et al. |
| 8,735,884 B2 | 5/2014 | Sakata et al. |
| 8,748,881 B2 | 6/2014 | Yamazaki |
| 8,759,132 B2 | 6/2014 | Kimura et al. |
| 8,779,420 B2 | 7/2014 | Yamazaki |
| 8,784,699 B2 | 7/2014 | Yano et al. |
| 8,785,242 B2 | 7/2014 | Yamazaki et al. |
| 8,858,844 B2 | 10/2014 | Yano et al. |
| 8,884,287 B2 | 11/2014 | Sakata et al. |
| 8,895,373 B2 | 11/2014 | Suzuki et al. |
| 8,921,857 B2 | 12/2014 | Moriwaki |
| 8,927,351 B2 | 1/2015 | Ichijo et al. |
| 9,105,659 B2 | 8/2015 | Yamazaki et al. |
| 9,130,046 B2 | 9/2015 | Sakata et al. |
| 9,136,389 B2 | 9/2015 | Yamazaki et al. |
| 9,171,867 B2 | 10/2015 | Kimura et al. |
| 9,171,919 B2 | 10/2015 | Ishikawa |
| 9,214,520 B2 | 12/2015 | Yamazaki |
| 9,384,976 B2 | 7/2016 | Ichijo et al. |
| 9,391,209 B2 | 7/2016 | Godo et al. |
| 9,520,411 B2 | 12/2016 | Takahashi et al. |
| 9,812,465 B2 | 11/2017 | Sakata et al. |
| 9,837,441 B2 | 12/2017 | Sakata et al. |
| 9,859,437 B2 | 1/2018 | Morosawa et al. |
| 9,887,298 B2 | 2/2018 | Yamazaki |
| 9,954,005 B2 | 4/2018 | Kimura et al. |
| 10,211,231 B2 | 2/2019 | Sakata et al. |
| 10,263,120 B2 | 4/2019 | Yamazaki |
| 10,332,912 B2 | 6/2019 | Takahashi et al. |
| 10,714,503 B2 | 7/2020 | Sakata et al. |
| 11,257,847 B2 | 2/2022 | Sakata et al. |
| 11,637,130 B2 | 4/2023 | Sakata et al. |
| 2001/0046027 A1 | 11/2001 | Tai et al. |
| 2002/0001889 A1 | 1/2002 | Kim et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0017303 A1 | 1/2005 | Ishikawa |
| 2005/0199959 A1 | 9/2005 | Chiang et al. |
| 2006/0035452 A1 | 2/2006 | Carcia et al. |
| 2006/0038242 A1 | 2/2006 | Hsu et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0001241 A1 | 1/2007 | Lim et al. |
| 2007/0024187 A1 | 2/2007 | Shin et al. |
| 2007/0040954 A1* | 2/2007 | Lee .................. H01L 27/12 257/E29.151 |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |

(56) References Cited

U.S. PATENT DOCUMENTS

| | | | |
|---|---|---|---|
| 2008/0258143 A1 | 10/2008 | Kim et al. | |
| 2008/0283830 A1 | 11/2008 | Ahn et al. | |
| 2008/0296568 A1 | 12/2008 | Ryu et al. | |
| 2009/0004872 A1 | 1/2009 | Okamoto | |
| 2009/0068773 A1 | 3/2009 | Lai et al. | |
| 2009/0073325 A1 | 3/2009 | Kuwabara et al. | |
| 2009/0078458 A1 | 3/2009 | Araumi | |
| 2009/0090942 A1* | 4/2009 | Kim | H01L 27/124 257/288 |
| 2009/0114910 A1 | 5/2009 | Chang | |
| 2009/0134399 A1 | 5/2009 | Sakakura et al. | |
| 2009/0134465 A1 | 5/2009 | Shimizu | |
| 2009/0152506 A1 | 6/2009 | Umeda et al. | |
| 2009/0152541 A1 | 6/2009 | Maekawa et al. | |
| 2009/0267087 A1* | 10/2009 | Yang | G02F 1/136286 438/30 |
| 2009/0278122 A1 | 11/2009 | Hosono et al. | |
| 2009/0280600 A1 | 11/2009 | Hosono et al. | |
| 2009/0283763 A1 | 11/2009 | Park et al. | |
| 2010/0051933 A1 | 3/2010 | Kim. et al. | |
| 2010/0052071 A1 | 3/2010 | Niimi et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117075 A1 | 5/2010 | Akimoto et al. | |
| 2010/0181565 A1 | 7/2010 | Sakata et al. | |
| 2010/0193785 A1 | 8/2010 | Kimura | |
| 2010/0203673 A1 | 8/2010 | Hayashi et al. | |
| 2010/0233848 A1* | 9/2010 | Ohara | H01L 21/02631 438/104 |
| 2011/0049511 A1 | 3/2011 | Yano et al. | |
| 2011/0065216 A1 | 3/2011 | Kaji et al. | |
| 2011/0095288 A1 | 4/2011 | Morosawa et al. | |
| 2011/0115839 A1 | 5/2011 | Takahashi et al. | |
| 2011/0127523 A1 | 6/2011 | Yamazaki | |
| 2011/0140095 A1 | 6/2011 | Kim et al. | |
| 2011/0186853 A1 | 8/2011 | Terai et al. | |
| 2011/0193081 A1 | 8/2011 | Godo et al. | |
| 2011/0215326 A1 | 9/2011 | Godo et al. | |
| 2011/0240998 A1 | 10/2011 | Morosawa et al. | |
| 2011/0297944 A1 | 12/2011 | Choi et al. | |
| 2012/0056173 A1* | 3/2012 | Pieralisi | H01L 29/4908 257/E29.296 |
| 2013/0270566 A1 | 10/2013 | Terai et al. | |
| 2013/0299824 A1 | 11/2013 | Akimoto et al. | |
| 2014/0087517 A1 | 3/2014 | Akimoto et al. | |
| 2014/0151692 A1 | 6/2014 | Godo et al. | |
| 2015/0108477 A1 | 4/2015 | Tokunaga | |
| 2016/0307776 A1 | 10/2016 | Ichijo et al. | |
| 2018/0076330 A1 | 3/2018 | Morosawa et al. | |
| 2019/0157314 A1 | 5/2019 | Kimura | |
| 2019/0172952 A1 | 6/2019 | Yamazaki | |
| 2022/0102391 A1 | 3/2022 | Kimura | |
| 2022/0102392 A1 | 3/2022 | Kimura | |
| 2022/0102393 A1 | 3/2022 | Kimura | |
| 2023/0238387 A1 | 7/2023 | Sakata et al. | |

FOREIGN PATENT DOCUMENTS

| | | |
|---|---|---|
| EP | 1737044 A | 12/2006 |
| EP | 2042546 A | 4/2009 |
| EP | 2120267 A | 11/2009 |
| EP | 2226847 A | 9/2010 |
| EP | 2408011 A | 1/2012 |
| EP | 2445011 A | 4/2012 |
| EP | 2927965 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-276726 A | 11/1989 |
| JP | 05-251705 A | 9/1993 |
| JP | 06-140428 A | 5/1994 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-033390 A | 1/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-327617 A | 11/2004 |
| JP | 2005-340788 A | 12/2005 |
| JP | 2006-060209 A | 3/2006 |
| JP | 2006-165528 A | 6/2006 |
| JP | 2006-253307 A | 9/2006 |
| JP | 2007-013128 A | 1/2007 |
| JP | 2007-073663 A | 3/2007 |
| JP | 2007-220816 A | 8/2007 |
| JP | 2008-091555 A | 4/2008 |
| JP | 2008-270313 A | 11/2008 |
| JP | 2009-033145 A | 2/2009 |
| JP | 2009-091548 A | 4/2009 |
| JP | 2009-099953 A | 5/2009 |
| JP | 2009-135350 A | 6/2009 |
| JP | 2009-278115 A | 11/2009 |
| JP | 2010-016163 A | 1/2010 |
| JP | 2010-062548 A | 3/2010 |
| JP | 2010-073894 A | 4/2010 |
| JP | 2010-135770 A | 6/2010 |
| JP | 2010-186994 A | 8/2010 |
| JP | 2010-212284 A | 9/2010 |
| JP | 2011-029635 A | 2/2011 |
| JP | 2011-054942 A | 3/2011 |
| JP | 2011-054951 A | 3/2011 |
| JP | 2011-108739 A | 6/2011 |
| JP | 2011-119719 A | 6/2011 |
| JP | 2011-129926 A | 6/2011 |
| JP | 2011-135063 A | 7/2011 |
| JP | 2011-141529 A | 7/2011 |
| JP | 2011-159908 A | 8/2011 |
| JP | 2011-176104 A | 9/2011 |
| JP | 2011-176294 A | 9/2011 |
| JP | 2011-181801 A | 9/2011 |
| JP | 2011-181917 A | 9/2011 |
| JP | 2011-211185 A | 10/2011 |
| JP | 2011-228622 A | 11/2011 |
| KR | 2010-0045913 A | 5/2010 |
| KR | 2011-0086190 A | 7/2011 |
| KR | 2011-0086878 A | 8/2011 |
| KR | 2011-0102513 A | 9/2011 |
| KR | 2011-0109885 A | 10/2011 |
| KR | 2012-0103616 A | 9/2012 |
| WO | WO-2004/114391 | 12/2004 |
| WO | WO-2009/041713 | 4/2009 |
| WO | WO-2010/053060 | 5/2010 |
| WO | WO-2010/113376 | 10/2010 |
| WO | WO-2010/147032 | 12/2010 |
| WO | WO-2011/055644 | 5/2011 |
| WO | WO-2011/058885 | 5/2011 |
| WO | WO-2011/065243 | 6/2011 |
| WO | WO-2011/093003 | 8/2011 |
| WO | WO-2011/096275 | 8/2011 |
| WO | WO-2011/111505 | 9/2011 |

OTHER PUBLICATIONS

Rard.J, "Chemistry and Thermodynamics of Ruthenium and Some of Its Inorganic Compounds and Aqueous Species", Chem. Rev. (Chemical Reviews), Feb. 1, 1985, vol. 85, No. 1, pp. 1-39, American Chemical Society.

Kadoshima.M et al., "Thermally Unstable Ruthenium Oxide Gate Electrodes in Metal/High-k Gate Stacks", Jpn. J. Appl. Phys.

(56) References Cited

OTHER PUBLICATIONS (Japanese Journal of Applied Physics), Apr. 25, 2008, vol. 47, No. 4, pp. 2108-2111.
9.13.1 Simple substance and Inorganic compound, Chemistry manual (the 4th edition of revision) basic volume (II), Sep. 30, 1993, vol. 2, pp. 285-294, Maruzen.
Fortunto.E et al., "Wide-Bandgap High-Mobility Zno Thin-Film Transistors Produced At Room Temperature", Appl. Phys. Lett. (Applied Physics Letters), Sep. 27, 2004, vol. 85, No. 13, pp. 2541-2543.
Dembo.H et al., "RFCPUS On Glass and Plastic Substrates Fabricated By TFT Transfer Technology", IEDM 05: Technical Digest of International Electron Devices Meeting, Dec. 5, 2005, pp. 1067-1069.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven By the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS On Flexible and Glass Substrates for Secure Rfid Systems", Journal of Solid-State Circuits, 2008, vol. 43, No. 1, pp. 292-299.
Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition: the "Blue Phase"", Physics Letters, Sep. 10, 1973, vol. 45A, No. 2, pp. 115-116.
Cho.D et al., "21.2:AL and Sn-Doped Zinc Indium Oxide Thin Film Transistors for Amoled Back-Plane", SID Digest '09 : SID International Symposium Digest of Technical Papers, May 31, 2009, pp. 280-283.
Lee.M et al., "15.4: Excellent Performance of Indium-Oxide-Based Thin-Film Transistors By DC Sputtering", SID Digest '09 : SID International Symposium Digest of Technical Papers, May 31, 2009, pp. 191-193.
Jin.D et al., "65.2: Distinguished Paper: World-Largest (6.5') Flexible Full Color Top Emission Amoled Display On Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge To Future Displays: Transparent AM-OLED Driven By Peald Grown ZnO TFT", IMID '07 DIGEST, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis On Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "Suftla Flexible Microelectronics On Their Way To Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions On Electron Devices, Jul. 1, 1995, vol. 42, No. 7, pp. 1240-1246.
Kikuchi.H et al., "39.1:Invited Paper: Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status Of, Challenges To, and Perspective View of AM-OLED ", IDW '06 : Proceedings of the 13th International Display Workshops, Dec. 7, 2006, pp. 663-666.
Kikuchi.H et al., "62.2: Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "SPINEL, YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu, or Zn] At Temperatures Over 1000°C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects In ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure To Water", Appl. Phys. Lett. (Applied Physics Letters) , 2008, vol. 92, pp. 072104-1-072104-3.
Hsieh.H et al., "p. 29: Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies In ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor On SrTiO3 With Sputtered Al2O3 Gate Insulator", Appl. Phys. Lett. (Applied Physics Letters) , Sep. 1, 2003, vol. 83, No. 9, pp. 1755-1757.
Jacob.K et al., "Thermodynamic properties of strontium titanates:Sr2TiO4, Sr3Ti2O7, Sr4Ti3O10, and SrTiO3", J. Chem. Thermodynamics, 2010, vol. 43, No. 1, pp. 51-57, Elsevier.

* cited by examiner

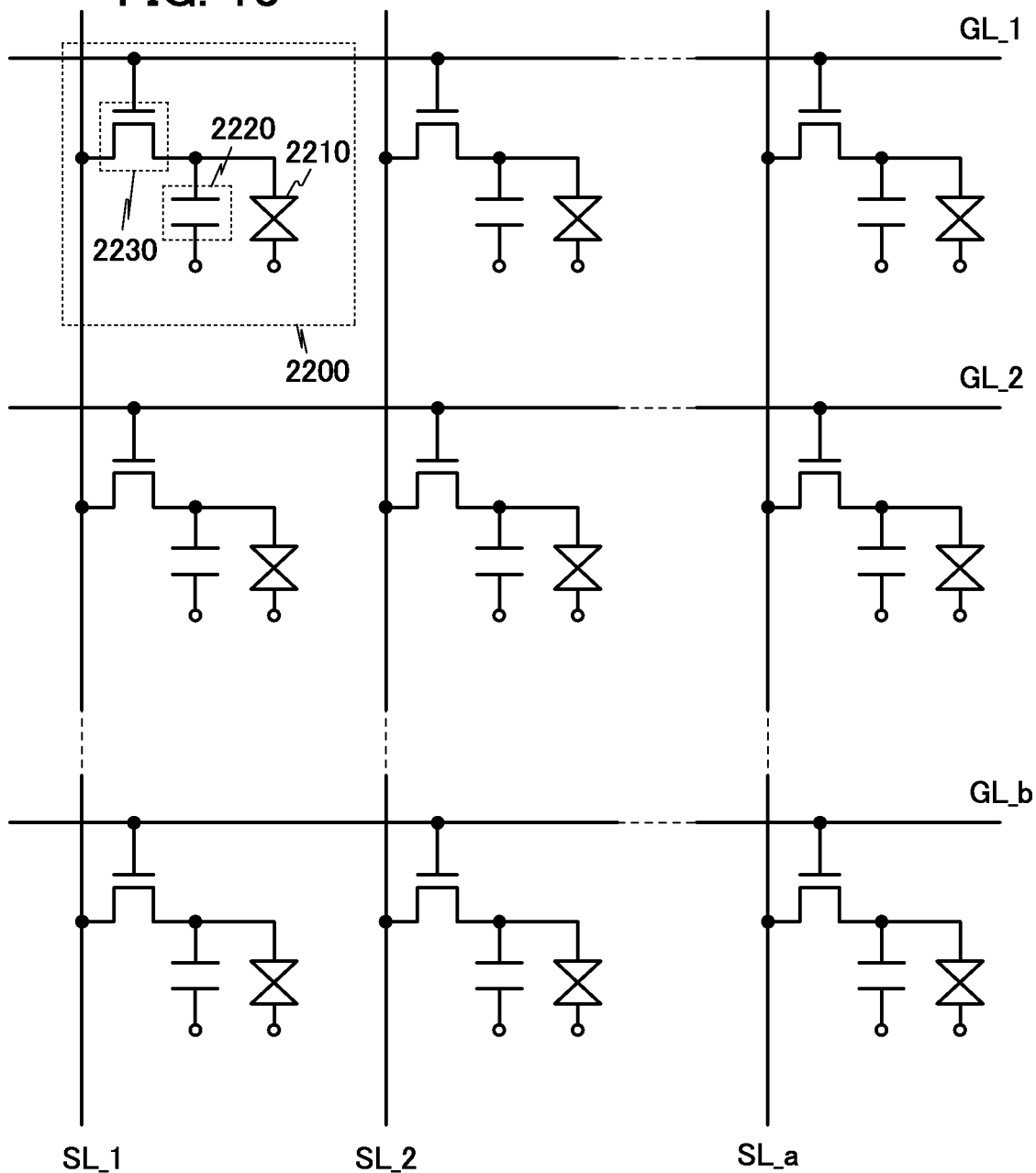

SEMICONDUCTOR DEVICE AND METHOD FOR MANUFACTURING THE SAME

BACKGROUND OF THE INVENTION

1. Field of the Invention

The present invention relates to a semiconductor device and a manufacturing method thereof.

Note that in this specification, a semiconductor device refers to any device that can function by utilizing semiconductor characteristics, and an electro-optical device, a semiconductor circuit, an electronic device, and the like are all semiconductor devices.

2. Description of the Related Art

A technique for forming a transistor by using a semiconductor film formed over a substrate having an insulating surface has attracted attention. The transistor is applied to a wide range of semiconductor devices such as an integrated circuit (IC) and an image display device (display device). A silicon-based semiconductor film is widely known as a semiconductor film applicable to the transistor. In recent years, an oxide-based semiconductor film has attracted attention.

For example, a transistor is disclosed in which an amorphous oxide film containing indium, gallium, and zinc and having an electron carrier concentration of lower than $10^{18}/cm^3$ is used (see Patent Document 1).

A transistor including an oxide semiconductor film has high electron mobility in the oxide semiconductor film as compared to a transistor including an amorphous silicon film; thus, operation speed thereof can be drastically increased. In addition, there is an advantage that capital investment can be reduced because part of production equipment for a transistor including an amorphous silicon film can be retrofitted and utilized.

REFERENCE

Patent Document

[Patent Document 1] Japanese Published Patent Application No. 2006-165528

SUMMARY OF THE INVENTION

When oxygen vacancies are caused in an oxide semiconductor film and the vicinity of the oxide semiconductor film, some of the oxygen vacancies serve as donors to generate electrons. Therefore, the threshold voltage of a transistor including an oxide semiconductor film having oxygen vacancies is shifted in the negative direction in some cases. Note that in this specification, the vicinity of an oxide semiconductor film means an interface between the oxide semiconductor film and a film in contact with the oxide semiconductor film.

An object of one embodiment of the present invention is to reduce oxygen vacancies in an oxide semiconductor film and the vicinity of the oxide semiconductor film and improve electric characteristics of a transistor including the oxide semiconductor film.

Another object of one embodiment of the present invention is to provide a highly reliable semiconductor device that includes a transistor including an oxide semiconductor film.

One embodiment of the present invention is a semiconductor device including an oxide semiconductor film, a gate electrode overlapping with the oxide semiconductor film, and a gate insulating film provided between the oxide semiconductor film and the gate electrode. Oxygen concentration of the gate electrode is lower in the vicinity of the interface with the gate insulating film than near the center thereof.

For example, in the case where the gate electrode has a thickness of 30 nm or more, a region of the gate electrode, which is 2 nm, 3 nm, or 5 nm away from the interface with the gate insulating film, has lower oxygen concentration than another region of the gate electrode, which is 10 nm, 15 nm, or 30 nm away from the interface.

The gate electrode includes a substance having higher Gibbs free energy for oxidation than a substance of the gate insulating film. That is, the gate electrode is more easily reduced than the gate insulating film. In other words, the gate electrode is more hardly oxidized than the gate insulating film. In the case where the gate insulating film has a stacked-layer structure, the gate electrode has higher Gibbs free energy for oxidation than any layer of the gate insulating film.

Specifically, the gate electrode preferably includes one or more elements selected from silver, copper, ruthenium, iridium, platinum, and gold.

One embodiment of the present invention is a semiconductor device including an oxide semiconductor film, a gate electrode overlapping with the oxide semiconductor film and including at least a first layer and a second layer, and a gate insulating film provided between the oxide semiconductor film and the gate electrode. The first layer of the gate electrode is provided in contact with the gate insulating film and has a lower oxygen concentration than the second layer of the gate electrode.

The first layer of the gate electrode includes a substance having higher Gibbs free energy for oxidation than a substance of the gate insulating film. That is, the first layer of the gate electrode is more easily reduced than the gate insulating film. In other words, the first layer of the gate electrode is more hardly oxidized than the gate insulating film. In the case where the gate insulating film has a stacked-layer structure, the first layer of the gate electrode has higher Gibbs free energy for oxidation than any layer of the gate insulating film.

The gate insulating film has an oxygen-transmitting property. In this specification, a film having an oxygen-transmitting property is a film through which oxygen molecules pass, or a film which has a sufficiently high diffusion coefficient of oxygen atoms and through which oxygen atoms pass by heat treatment or the like in a manufacturing process.

An insulating film having a low oxygen-transmitting property is preferably provided in contact with at least a side surface of the first layer of the gate electrode. In this specification, a film having a low oxygen-transmitting property is a film through which oxygen molecules do not pass and a film which has a sufficiently low diffusion coefficient of oxygen atoms and through which oxygen atoms do not pass by heat treatment or the like in a manufacturing process. With the insulating film having a low oxygen-transmitting property, outward diffusion of oxygen that is released from the first layer of the gate electrode is reduced and oxygen can be efficiently supplied to the oxide semiconductor film.

Specifically, the first layer and the second layer of the gate electrode preferably include an oxide including one or more elements selected from silver, copper, ruthenium, iridium, platinum, and gold. An oxide including the element has high Gibbs free energy for oxidation; thus, the oxide itself is easily reduced and easily oxidizes a film in contact therewith.

Alternatively, it is preferable that the first layer of the gate electrode be formed using a metal including one or more elements selected from silver, copper, ruthenium, iridium, platinum, and gold, and the second layer of the gate electrode be formed using an oxide including one or more elements selected from silver, copper, ruthenium, iridium, platinum, and gold.

One embodiment of the present invention is a method for manufacturing a semiconductor device including the steps of forming a gate electrode including at least an oxide; forming a gate insulating film to cover the gate electrode; and forming an oxide semiconductor film which overlaps with the gate electrode with the gate insulating film provided therebetween and then performing heat treatment to supply oxygen from the gate electrode to the oxide semiconductor film through the gate insulating film.

One embodiment of the present invention is a method for manufacturing a semiconductor device including the steps of forming an oxide semiconductor film; forming a gate insulating film over the oxide semiconductor film; and forming a gate electrode which overlaps with the oxide semiconductor film with the gate insulating film provided therebetween and includes at least an oxide and then performing heat treatment to supply oxygen from the gate electrode to the oxide semiconductor film through the gate insulating film.

One embodiment of the present invention is a method for manufacturing a semiconductor device including the steps of depositing an oxide semiconductor film; depositing a gate insulating film over the oxide semiconductor film; depositing a conductive film which includes at least an oxide over the gate insulating film and then performing heat treatment to supply oxygen from the conductive film to the oxide semiconductor film through the gate insulating film; and processing the conductive film which supplies oxygen to the oxide semiconductor film to form a gate electrode.

By application of one embodiment of the present invention, oxygen moves from a gate electrode to a gate insulating film, passes through the gate insulating film, and is supplied to an oxide semiconductor film in contact with the gate insulating film. Thus, oxygen vacancies in the oxide semiconductor film and the vicinity of the oxide semiconductor film can be reduced. This is because the gate electrode has higher Gibbs free energy for oxidation than the gate insulating film, in a region where the gate electrode is in contact with the gate insulating film. As a result, change in electric characteristics of a transistor including the oxide semiconductor film can be suppressed.

Oxygen vacancies in the oxide semiconductor film and/or the vicinity of the oxide semiconductor film might be generated due to operation of the transistor. In particular, oxygen vacancies at the interface between the oxide semiconductor film and the gate insulating film greatly influence electric characteristics of the transistor. Even in such a case, oxygen sufficiently contained in the gate electrode can reduce generated oxygen vacancies. Therefore, change in electric characteristics of a transistor according to one embodiment of the present invention, which is due to oxygen vacancies, is unlikely to occur. That is, a semiconductor device including the transistor has high reliability.

Oxygen vacancies in the oxide semiconductor film and the vicinity of the oxide semiconductor film can be reduced and electric characteristics of a transistor including the oxide semiconductor film can be improved.

Further, reliability of a semiconductor device that includes the transistor including the oxide semiconductor film can be increased.

BRIEF DESCRIPTION OF THE DRAWINGS

In the accompanying drawings:

FIG. 13 is a circuit diagram illustrating an example of a liquid crystal display device according to one embodiment of the present invention;

DETAILED DESCRIPTION OF THE INVENTION

Figure 1A:
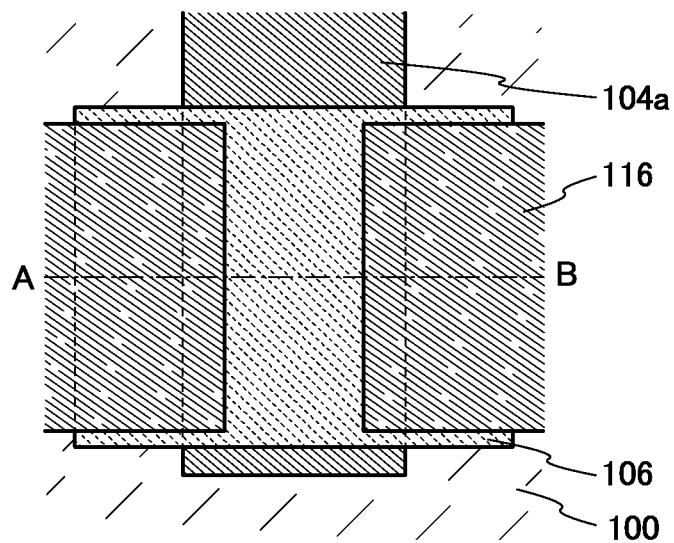
FIGS. 1A to 1C are a top view and cross-sectional views illustrating examples of a transistor according to one embodiment of the present invention.

Embodiments of the present invention will be described below with reference to the drawings. However, the present invention is not limited to the description below, and it is easily understood by those skilled in the art that modes and details disclosed herein can be modified in various ways. The present invention is not construed as being limited to description of the embodiments below. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that ordinal numbers such as "first" and "second" are used for convenience and do not denote the order of steps or the stacking order of layers. In addition, the ordinal numbers in this specification do not denote particular names which specify the present invention.

Embodiment 1

In this embodiment, a transistor according to one embodiment of the present invention will be described with reference to FIGS. 1A to 1C, FIGS. 2A to 2C, and FIGS. 3A to 3C.

Figure 1B:
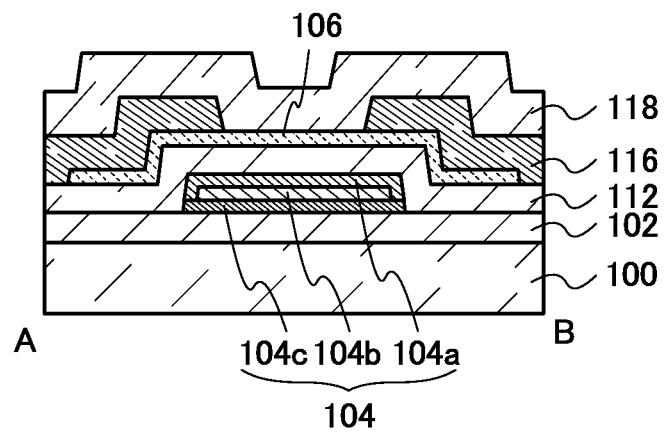

FIG. 1A is a top view of the transistor according to one embodiment of the present invention. FIG. 1B is a cross-sectional view along dashed-dotted line A-B in FIG. 1A. Note that for simplicity, a protective insulating film 118, a gate insulating film 112, and the like are not shown in FIG. 1A.

The transistor in FIG. 1B includes a base insulating film 102 over a substrate 100, a gate electrode 104 including a first layer 104a, a second layer 104b, and a third layer 104c over the base insulating film 102, a gate insulating film 112 provided to cover at least the gate electrode 104, an oxide semiconductor film 106 provided to overlap with the gate electrode 104 with the gate insulating film 112 provided therebetween, and a pair of electrodes 116 over the oxide semiconductor film 106. The first layer 104a of the gate electrode 104 is in contact with the gate insulating film 112. The third layer 104c of the gate electrode 104 is in contact with the base insulating film 102. The second layer 104b of the gate electrode 104 is provided between the first layer 104a and the third layer 104c. The transistor in FIG. 1B preferably includes a protective insulating film 118 which is provided to cover at least the oxide semiconductor film 106 and the pair of electrodes 116. A back gate electrode may be provided over the oxide semiconductor film 106 with the protective insulating film 118 provided therebetween.

In this specification, "B provided to cover A" is not limited to meaning that B is provided to be in contact with at least an upper surface and a side surface of A, and another material may be provided between A and B. For connection with a wiring or the like, B may include an opening to expose part of A.

Here, the first layer 104a of the gate electrode 104 has lower oxygen concentration than the second layer 104b of the gate electrode 104. The third layer 104c of the gate electrode 104 has higher conductivity than the first layer 104a and the second layer 104b of the gate electrode 104.

The first layer 104a and the second layer 104b of the gate electrode 104 are formed using a substance having higher Gibbs free energy for oxidation than a substance of the gate insulating film 112. That is, the first layer 104a and the second layer 104b of the gate electrode 104 are more easily reduced than the gate insulating film 112. In other words, the first layer 104a and the second layer 104b of the gate electrode 104 are more hardly oxidized than the gate insulating film 112.

Figure 21:
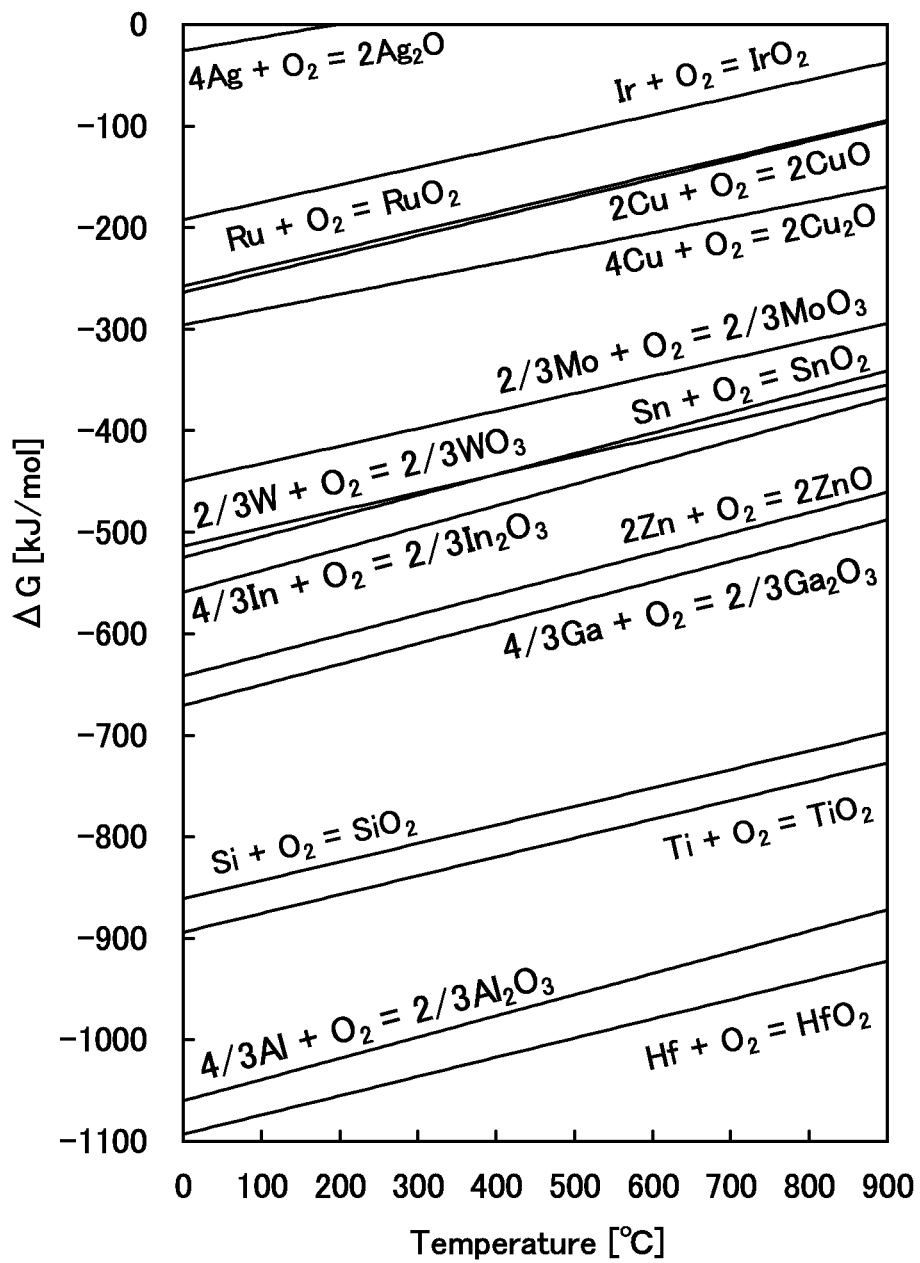
FIG. 21 shows Gibbs free energy for oxidation.

For reference, FIG. 21 shows Gibbs free energy of elements for oxidation. In FIG. 21, the horizontal axis indicates temperature [° C.] and the vertical axis indicates Gibbs free energy ($\Delta G$ [kJ/mol]). The Gibbs free energy for the oxidation shown in FIG. 21 is obtained by the following calculation. First, values of standard enthalpy of formation $\Delta H$ and standard entropy of formation $\Delta S$ of substances in oxidation are calculated by substituting values of standard enthalpy of formation $\Delta H$ and standard entropy S of the substances in Table 1 into respective oxidation equations in Table 2. The obtained values of standard enthalpy of formation $\Delta H$ and standard entropy of formation $\Delta S$ in each oxidation are shown in Table 2. Note that *Chemistry manual (the 4th edition of revision) basic volume (II)* ed. by Chemical Society of Japan, Maruzen Co., Ltd. is mainly referred to for the values of standard enthalpy of formation $\Delta H$ and standard entropy S of the substances in Table 1.

TABLE 1

| Substance | $\Delta H$ [kJ/mol] Standard Enthalpy of Formation | S [J/(Kmol)] Standard Entropy |
|---|---|---|
| $O_2$ | 0 | 205.1 |
| Si | 0 | 18.83 |
| $SiO_2$ | −910.9 | 41.84 |
| In | 0 | 57.82 |
| $In_2O_3$ | −925.8 | 104.2 |
| Ga | 0 | 40.88 |
| $Ga_2O_3$ | −1089 | 84.98 |
| Zn | 0 | 41.63 |
| ZnO | −348.3 | 43.64 |
| Sn | 0 | 51.55 |
| $SnO_2$ | −580.7 | 52.3 |
| Al | 0 | 28.33 |
| $Al_2O_3$ | −1676 | 50.92 |
| W | 0 | 32.64 |
| $WO_3$ | −842.9 | 75.9 |
| Mo | 0 | 28.66 |
| $MoO_3$ | −745.1 | 77.74 |
| Cu | 0 | 33.15 |
| CuO | −157.3 | 42.63 |
| $CuO_2$ | −168.6 | 93.14 |
| Ti | 0 | 30.63 |
| $TiO_2$ (rutile) | −944.7 | 50.33 |
| Hf | 0 | 43.56 |
| $HfO_2$ | −1145 | 59.33 |
| Ru | 0 | 28.53 |
| $RuO_2$ | −307 | 52.2 |
| Ag | 0 | 42.55 |
| $Ag_2O$ | −31.05 | 121.3 |
| Ir | 0 | 35.48 |
| $IrO_2$ | −249.5 | 50.99 |

TABLE 2

| Oxidation Formula | ΔH [kJ/mol] Standard Enthalpy of Formation | ΔS [J/mol] Standard Entropy of Formation |
|---|---|---|
| $Si + O_2 = SiO_2$ | −910.9 | −182.1 |
| $4/3In + O_2 = 2/3In_2O_3$ | −617.2 | −212.8 |
| $Sn + O_2 = SnO_2$ | −580.7 | −204.4 |
| $4/3Ga + O_2 = 2/3Ga_2O_3$ | −726.1 | −203.0 |
| $2Zn + O_2 = 2ZnO$ | −696.6 | −201.1 |
| $2/3W + O_2 = 2/3WO_3$ | −561.9 | −176.3 |
| $2/3Mo + O_2 = 2/3MoO_3$ | −496.7 | −172.4 |
| $2Cu + O_2 = 2CuO$ | −314.6 | −186.2 |
| $4Cu + O_2 = 2Cu_2O$ | −337.2 | −151.5 |
| $4/3Al + O_2 = 2/3Al_2O_3$ | −1117 | −209.0 |
| $Ti + O_2 = TiO_2$ | −944.7 | −185.4 |
| $Hf + O_2 = HfO_2$ | −1145 | −189.4 |
| $4Ag + O_2 = 2Ag_2O$ | −62.10 | −132.7 |
| $Ru + O_2 = RuO_2$ | −307.0 | −181.5 |
| $Ir + O_2 = IrO_2$ | −249.5 | −189.6 |

Next, values of Gibbs free energy in each oxidation in the temperature range of 0° C. to 900° C. are calculated by substituting the values of standard enthalpy of formation ΔH and standard entropy of formation ΔS shown in Table 2 into Formula (1) below. Note that T in Formula (1) represents a temperature [K].

$$\Delta G = \Delta H - T\Delta S \times 10^{-3} \quad (1)$$

From FIG. 21, for example, a layer of an oxide including one or more elements selected from silver, copper, ruthenium and iridium can be used for the first layer 104a and the second layer 104b of the gate electrode 104. The oxide has high Gibbs free energy for oxidation; thus, the oxide itself is easily reduced and easily oxidizes a film in contact therewith. An oxide including ruthenium or iridium is preferably used because of its high conductivity. As examples of an oxide including ruthenium or iridium, $RuO_X$ (X is greater than or equal to 0.5 and less than or equal to 3), $IrO_X$ (X is greater than or equal to 0.5 and less than or equal to 3), or $SrRuO_X$ (X is greater than or equal to 1 and less than or equal to 5) can be given.

Alternatively, the first layer 104a of the gate electrode 104 is formed using a metal including one or more elements selected from silver, copper, ruthenium, iridium, platinum, and gold, and the second layer 104b of the gate electrode 104 is formed using an oxide including one or more elements selected from silver, copper, ruthenium, iridium, platinum, and gold.

As compared to the case where a substance whose work function is less than or equal to 4.7 eV is used for the first layer 104a of the gate electrode 104, it is preferable to use a substance whose work function is greater than 5 eV, preferably greater than 5.2 eV, such as iridium, platinum, ruthenium oxide, or gold, which enables the threshold voltage of the transistor to be shifted more in the positive direction.

The third layer 104c of the gate electrode 104 is formed using a metal including one or more elements selected from silver, copper, ruthenium, iridium, platinum, and gold. Note that the third layer 104c of the gate electrode 104 preferably includes a substance whose Gibbs free energy for oxidation is almost the same as or higher than a substance of the second layer 104b of the gate electrode 104 because in which case, oxygen is hardly taken away from the second layer 104b of the gate electrode 104.

The gate insulating film 112 can be formed to have a single-layer or stacked-layer structure using one or more insulators including the following materials: aluminum oxide, magnesium oxide, silicon oxide, silicon oxynitride, germanium oxide, yttrium oxide, zirconium oxide, lanthanum oxide, neodymium oxide, hafnium oxide, and tantalum oxide.

The gate insulating film 112 has an oxygen-transmitting property. An oxygen-transmitting film is a film through which oxygen molecules pass, or a film which has a sufficiently high diffusion coefficient of oxygen atoms and through which oxygen atoms pass by heat treatment or the like in a manufacturing process. For example, a film through which oxygen molecules pass has low density such that oxygen molecules can pass through the film. Specifically, the film density is preferably lower than 3.2 $g/cm^3$. A diffusion coefficient of oxygen atoms in the film through which oxygen atoms pass at higher than or equal to 150° C. and lower than or equal to 450° C., although depending on the thickness of the gate insulating film 112, is greater than or equal to $3\times10^{-16}$ $cm^2/s$, preferably greater than or equal to $1\times10^{-15}$ $cm^2/s$, more preferably greater than or equal to $8\times10^{-15}$ $cm^2/s$.

With the above-described gate electrode 104 and gate insulating film 112, oxygen can be supplied from the gate electrode 104 to the oxide semiconductor film 106 through the gate insulating film 112. Accordingly, oxygen vacancies in the oxide semiconductor film 106 and the vicinity of the oxide semiconductor film 106 are reduced. Thus, change in electric characteristics of the transistor due to oxygen vacancies in the oxide semiconductor film 106 and the vicinity of the oxide semiconductor film 106 can be suppressed.

As the oxide semiconductor film 106, an In-M-Zn oxide film may be used, for example. Here, a metal element M is an element whose bond energy with oxygen is higher than that of In and that of Zn. Alternatively, the metal element M is an element which has a function of suppressing desorption of oxygen from the In-M-Zn oxide film. Owing to the effect of the metal element M, generation of oxygen vacancies in the oxide semiconductor film is suppressed. Therefore, change in electric characteristics of the transistor, which is caused by oxygen vacancies, can be reduced.

The metal element M can be, specifically, Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. The metal element M can be formed using one or more elements selected from the above elements. Further, Si or Ge may be used instead of the metal element M.

The oxide semiconductor film 106 can be in a single crystal state, a polycrystalline (also referred to as polycrystal) state, an amorphous state, or the like.

The oxide semiconductor film 106 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in carrier mobility, due to the grain boundary, is suppressed.

In each of the crystal parts included in the CAAC-OS film, a c-axis is aligned in a direction parallel to a normal vector of a surface on which the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film 106, the proportion of crystal parts in the vicinity of the surface of the oxide semiconductor film is higher than that in the vicinity of the surface on which the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface on which the CAAC-OS film is formed or a normal vector of a surface of the CAAC-OS film, the directions of the c-axes may be different from each other depending on the shape of the CAAC-OS film (the cross-sectional shape of the surface on which the CAAC-OS film is formed or the cross-sectional shape of the surface of the CAAC-OS film). Note that when the CAAC-OS film is formed, the direction of c-axis of the crystal part is the direction parallel to a normal vector of the surface on which the CAAC-OS film is formed or a normal vector of the surface of the CAAC-OS film. The crystal part is formed by film formation or by performing treatment for crystallization such as heat treatment after film formation.

In an oxide semiconductor film, the bandgap is approximately 2.8 eV to 3.2 eV, the density of minority carriers is as extremely low as approximately $10^{-9}/cm^3$, and majority carriers flow only from a source of a transistor. Therefore, a transistor including an oxide semiconductor film has no avalanche breakdown.

In the transistor including an oxide semiconductor film, the electric field of a gate electrode makes a channel region of the transistor completely-depleted; therefore, for example, an off-state current with a channel length of 3 μm and a channel width of 1 μm can be lower than or equal to $10^{-23}$ ampere (A) at 85° C. to 95° C. and further lower (specifically, lower than or equal to $10^{-25}$ ampere (A) at room temperature.

With use of the oxide semiconductor film in a transistor, change in electric characteristics of the transistor due to irradiation with visible light or ultraviolet light is small. Thus, the transistor has high reliability.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Further alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used. Any of these substrates further provided with a semiconductor element may be used as the substrate 100.

In the case where a large glass substrate such as the 5th generation (1000 mm×1200 mm or 1300 mm×1500 mm), the 6th generation (1500 mm×1800 mm), the 7th generation (1870 mm×2200 mm), the 8th generation (2200 mm×2500 mm), the 9th generation (2400 mm×2800 mm), or the 10th generation (2880 mm×3130 mm) is used as the substrate 100, minute processing is sometimes difficult due to shrinkage of the substrate 100 caused by heat treatment or the like in a manufacturing process of a semiconductor device. Therefore, in the case where the above-described large glass substrate is used as the substrate 100, a substrate with small shrinkage is preferably used. For example, as the substrate 100, it is possible to use a large glass substrate in which the amount of shrinkage after heat treatment which is performed for an hour at 400° C., preferably 450° C., more preferably 500° C. is less than or equal to 10 ppm, preferably less than or equal to 5 ppm, more preferably less than or equal to 3 ppm.

Alternatively, a flexible substrate may be used as the substrate 100. Note that as a method for forming a transistor over a flexible substrate, there is a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

The base insulating film 102 is provided in order that an impurity due to the substrate 100 is prevented from affecting the oxide semiconductor film 106. Note that in the case where the substrate 100 does not include an impurity, the base insulating film 102 is not necessarily provided.

The base insulating film 102 can be formed to have a single-layer or stacked-layer structure using one or more insulators including the following materials: aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

Silicon oxynitride refers to a substance that contains more oxygen than nitrogen and, for example, includes oxygen, nitrogen, silicon, and hydrogen at concentrations higher than or equal to 50 at. % and lower than or equal to 70 at. %, higher than or equal to 0.5 at. % and lower than or equal to 15 at. %, higher than or equal to 25 at. % and lower than or equal to 35 at. %, and higher than or equal to 0 at. % and lower than or equal to 10 at. %, respectively. Further, silicon nitride oxide refers to a substance that contains more nitrogen than oxygen and, for example, contains oxygen, nitrogen, silicon, and hydrogen at concentrations higher than or equal to 5 at. % and lower than or equal to 30 at. %, higher than or equal to 20 at. % and lower than or equal to 55 at. %, higher than or equal to 25 at. % and lower than or equal to 35 at. %, and higher than or equal to 10 at. % and lower than or equal to 25 at. %, respectively. Note that percentages of oxygen, nitrogen, silicon, and hydrogen fall within the aforementioned ranges in the case where measurement is performed using Rutherford backscattering spectrometry (RBS) or hydrogen forward scattering spectrometry (HFS). In addition, the total of the percentages of the constituent elements does not exceed 100 at. %.

The pair of electrodes 116 may be formed to have a single-layer or stacked-layer structure using one or more of Al, Ti, Cr, Co, Ni, Cu, Y, Zr, Mo, Ag, Ta, and W, a nitride of any of these elements, an oxide of any of these elements, and an alloy of any of these elements. In this embodiment, the pair of electrodes 116 is in contact with an upper surface of the oxide semiconductor film 106; however, one embodiment of the present invention is not limited thereto. For example, the pair of electrodes 116 may be in contact with a lower surface of the oxide semiconductor film 106. Further, conductivity of the oxide semiconductor film 106 may be higher in the vicinity of a portion in contact with the pair of electrodes 116 than the other portion.

The protective insulating film 118 can be formed to have a single-layer or stacked-layer structure using one or more insulators including the following materials: aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

It is preferable that the protective insulating film 118 have low relative permittivity and a sufficient thickness. For example, a silicon oxide film having a relative permittivity of approximately 3.8 and a thickness of greater than or equal to 200 nm and less than or equal to 1000 nm may be provided. A surface of the protective insulating film 118 has a little fixed charge because of the influence of atmospheric components and the like, which might cause the shift of the threshold voltage of the transistor. Therefore, it is preferable that the protective insulating film 118 have relative permittivity and a thickness such that the influence of the charge at the surface is sufficiently reduced. For the same reason, a resin film may be formed over the protective insulating film 118 to reduce the influence of the charge at the surface.

Figure 1C:
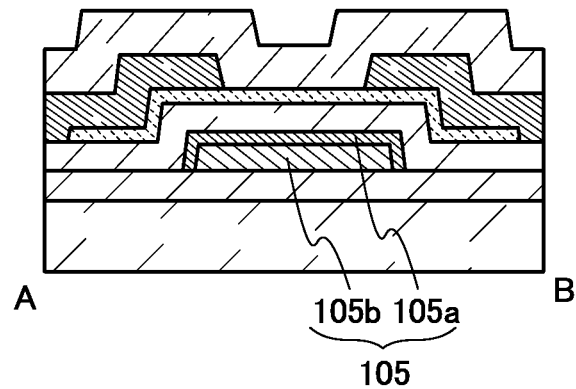

The transistor in FIG. 1C is different from the transistor in FIG. 1B in the structure of a gate electrode. Specifically, a gate electrode 105 of the transistor in FIG. 1C includes a first layer 105a and a second layer 105b which are similar to the first layer 104a and the second layer 104b of the gate electrode 104, respectively. That is, the gate electrode 105 has a structure in which the third layer 104c is omitted from the gate electrode 104. Consequently, although the gate electrode 105 has higher resistance than the gate electrode 104 because of the third layer 104c, formation thereof becomes easier.

A method for manufacturing the transistor in FIG. 1B is described below with reference to FIGS. 2A to 2C and FIGS. 3A to 3C.

First, the substrate 100 is prepared and the base insulating film 102 is deposited over the substrate 100. The base insulating film 102 can be deposited by a sputtering method, a chemical vapor deposition (CVD) method, a molecular beam epitaxy (MBE) method, an atomic layer deposition (ALD) method, or a pulsed laser deposition (PLD) method.

Figure 2A:
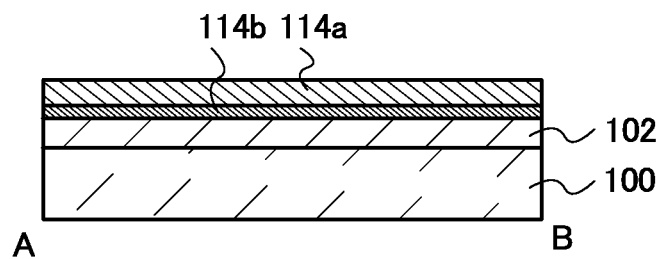
FIGS. 2A to 2C are cross-sectional views illustrating an example of a method for manufacturing a transistor according to one embodiment of the present invention.

Next, the conductive film 114b and the conductive film 114a are deposited in this order (see FIG. 2A). The conductive film 114a is a metal oxide film. In addition, the conductive film 114b is a metal film having lower resistance than the conductive film 114a. The conductive film 114b and the conductive film 114a can be deposited by a sputtering method, a CVD method, an MBE method, an ALD method, or a PLD method.

Figure 2B:
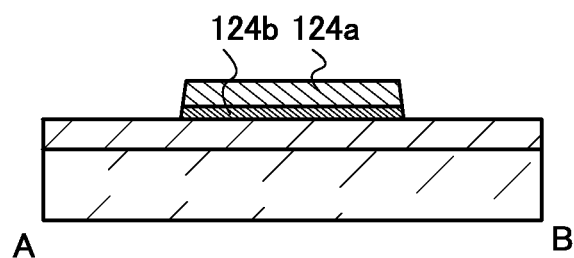

Next, the conductive film 114b and the conductive film 114a are processed, whereby the conductive film 124b and the conductive film 124a are shaped into the gate electrode to be formed later (see FIG. 2B).

Note that the simple term "processing" means in this specification that a film is formed into a desired shape using a resist mask formed by a photolithography process.

Note that halogen and hydrogen in the oxide semiconductor film cause carriers in some cases. In the case where ruthenium or ruthenium oxide is used for the conductive film 114a, the conductive film 114a can be etched using only plasma generated from oxygen, a rare gas (preferably argon), or the like with neither halogen nor hydrogen. The conductive film 114a is etched without using halogen and hydrogen, which hardly causes entry of halogen and hydrogen into the oxide semiconductor film; thus, change in threshold voltage of the transistor can be suppressed.

Next, the gate insulating film 112 is deposited. The gate insulating film 112 can be deposited by a sputtering method, a CVD method, an MBE method, an ALD method, or a PLD method.

For the gate insulating film 112, a sputtering method is preferably used. At this time, a deposition gas is used which includes an oxidizing gas (oxygen, ozone, or nitrous oxide) at 5% or more, preferably 10% or more, further preferably 20% or more, still further preferably 50% or more. As the deposition gas, a gas in which the concentration of impurities such as hydrogen is low is used. Further, a substrate heating temperature at the time of deposition is higher than or equal to room temperature and lower than or equal to 200° C., preferably higher than or equal to room temperature and lower than or equal to 150° C., further preferably higher than or equal to room temperature and lower than or equal to 120° C. When the gate insulating film 112 is deposited in the above-described manner, the gate insulating film 112 has low concentration of impurities such as hydrogen and can easily contain excess oxygen, so that the gate insulating film 112 which releases oxygen by heat treatment can be deposited.

As the gate insulating film 112, an insulating film which releases oxygen by heat treatment at a temperature higher than or equal to 150° C. and lower than or equal to 650° C. or higher than or equal to 200° C. and lower than or equal to 450° C. is used.

In a transistor including an oxide semiconductor film, oxygen vacancies in the oxide semiconductor film serve as donors, which causes a shift of the threshold voltage of the transistor in the negative direction. Oxygen vacancies at an interface between a gate insulating film and the oxide semiconductor film are a major factor of change in electric characteristics of the transistor. Therefore, reduction in oxygen vacancies in the oxide semiconductor film and at the interface between the oxide semiconductor film and the gate insulating film leads to stable electric characteristics of the transistor including the oxide semiconductor film and improvement in reliability. Therefore, oxygen is preferably released from the gate insulating film because oxygen vacancies in the oxide semiconductor film and at the interface between the oxide semiconductor film and the gate insulating film can be reduced.

Note that the expression "oxygen is released by heat treatment" means that the amount of released oxygen when converted into oxygen atoms in thermal desorption spectroscopy (TDS) analysis is $1.0 \times 10^{19}$ atoms/cm$^3$ or more, $3.0 \times 10^{19}$ atoms/cm$^3$ or more, $1.0 \times 10^{20}$ atoms/cm$^3$ or more, or $3.0 \times 10^{20}$ atoms/cm$^3$ or more.

Here, a method in which the amount of released oxygen is measured by being converted into oxygen atoms using TDS analysis is described.

The total amount of released gas from a measurement sample in TDS analysis is proportional to the integral value of the ion intensity of the released gas. Then, a comparison with the reference value of a standard sample is made, whereby the total amount of released gas can be calculated.

For example, the number of released oxygen molecules ($N_{O2}$) from a measurement sample can be calculated according to Formula (2) using the TDS analysis results of the standard sample, which is a silicon wafer containing hydrogen at a predetermined density, and the TDS analysis results of the measurement sample. Here, all gasses having a mass-to-charge ratio (M/z) of 32 which are obtained by the TDS analysis are assumed to originate from an oxygen molecule. $CH_3OH$, which is given as a gas at M/z=32, is not taken into consideration on the assumption that it is unlikely to be present. Further, an oxygen molecule including an oxygen atom where M/z=17 or 18, which is an isotope of an oxygen atom, is also not taken into consideration because the proportion of such a molecule in the natural world is minimal.

$$N_{O2} = \frac{N_{H2}}{S_{H2}} \times S_{O2} \times \alpha \qquad (2)$$

The value $N_{H2}$ is obtained by conversion of the number of hydrogen molecules desorbed from the standard sample into density. $S_{H2}$ is the integral value of ion intensity when the standard sample is analyzed by TDS analysis. Here, the reference value of the standard sample is expressed by $N_{H2}/S_{H2}$. $S_{O2}$ is the integral value of ion intensity when the measurement sample is analyzed by TDS analysis. $\alpha$ is a coefficient affecting the ion intensity in the TDS analysis. For details of Formula (2), Japanese Published Patent Application No. H6-275697 and U.S. Pat. No. 5,528,032 are referred to. Note that the amount of released oxygen was measured with a thermal desorption spectroscopy apparatus manufactured by ESCO Ltd., EMD-WA1000S/W using a silicon wafer containing hydrogen atoms at $1 \times 10^{16}$ atoms/$cm^3$ as the standard sample.

Further, in the TDS analysis, part of oxygen is detected as an oxygen atom. The ratio between oxygen molecules and oxygen atoms can be calculated from the ionization rate of oxygen molecules. Note that since the above $\alpha$ includes the ionization rate of oxygen molecules, the number of released oxygen atoms can be estimated through the evaluation of the number of the released oxygen molecules.

Note that $N_{O2}$ is the number of released oxygen molecules. When the number of released oxygen molecules is converted into the number of released oxygen atoms, the number of released oxygen atoms is twice the number of released oxygen molecules.

Figure 2C:
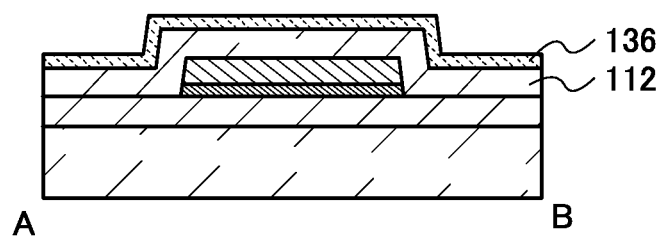

Then, an oxide semiconductor film 136 is deposited over the gate insulating film 112 (see FIG. 2C). The oxide semiconductor film 136 can be deposited by a sputtering method, a CVD method, an MBE method, an ALD method, or a PLD method.

For the oxide semiconductor film 136, a sputtering method is preferably used. At this time, a deposition gas is used which includes an oxidizing gas at 5% or more, preferably 10% or more, further preferably 20% or more, still further preferably 50% or more. As the deposition gas, a gas in which the concentration of impurities such as hydrogen is low is used.

Next, heat treatment is performed. The heat treatment is performed in an inert gas (nitrogen, or a rare gas such as helium, neon, argon, krypton, or xenon) atmosphere, an atmosphere containing an oxidizing gas at 10 ppm or more, preferably 1% or more, further preferably 10% or more, or a reduced pressure state (10 Pa or lower, preferably 1 Pa or lower, further preferably 0.1 Pa or lower), at a temperature higher than or equal to 150° C. and lower than or equal to 650° C., preferably higher than or equal to 200° C. and lower than or equal to 450° C.

Part of the conductive film 124a is reduced by the heat treatment and oxygen generated by the reduction reaches into the oxide semiconductor film 136 and the vicinity of the oxide semiconductor film 136 through the gate insulating film 112, whereby oxygen vacancies in the oxide semiconductor film 136 and the vicinity of the oxide semiconductor film 136 can be reduced.

As described above, by reducing part of the conductive film 124a, the first layer 104a having lower oxygen concentration than the conductive film 124a and the second layer 104b having almost the same oxygen concentration as the conductive film 124a are formed. The conductive film 124b becomes the third layer 104c without particular change. As a result, the gate electrode 104 including the first layer 104a, the second layer 104b, and the third layer 104c is formed (see FIG. 3A).

Here, in the case where the substrate temperature in the deposition of the oxide semiconductor film 136 is higher than or equal to 150° C. and lower than or equal to 450° C., preferably higher than or equal to 200° C. and lower than or equal to 400° C., the deposition can also serve as the above heat treatment.

In the case where an insulating film which releases oxygen by heat treatment is used as the gate insulating film 112, oxygen is supplied from the gate insulating film 112 to the oxide semiconductor film 106 by the heat treatment. However, the film quality of the gate insulating film 112 might be decreased due to the release of oxygen. In that case, oxygen is supplied from the conductive film 124a to the gate insulating film 112, which can suppress decrease in the film quality of the gate insulating film 112 due to the release of oxygen.

Figure 3A:
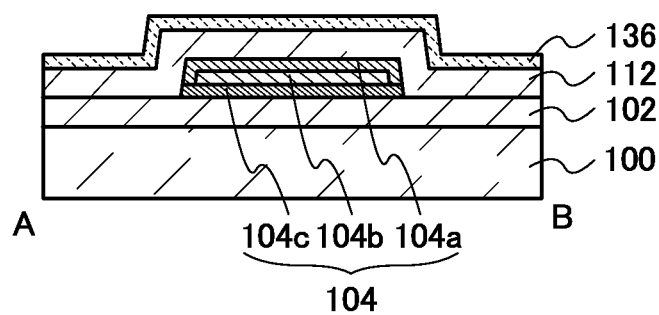
FIGS. 3A to 3C are cross-sectional views illustrating an example of a method for manufacturing a transistor according to one embodiment of the present invention.
Figure 3B:
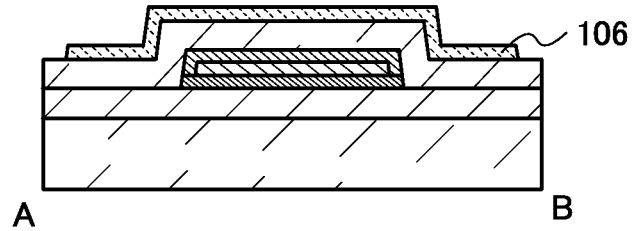

Next, the oxide semiconductor film 136 is processed to form the island-shaped oxide semiconductor film 106 (see FIG. 3B).

Next, a conductive film to be the pair of electrodes 116 is deposited. The conductive film to be the pair of electrodes 116 can be deposited by a sputtering method, a CVD method, an MBE method, an ALD method, or a PLD method. Then, the conductive film to be the pair of electrodes 116 is processed into the pair of electrodes 116.

Figure 3C:
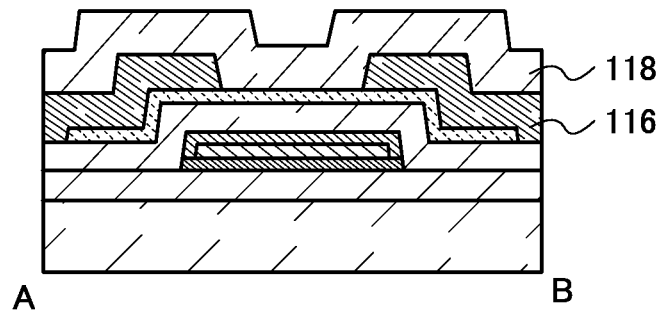

Next, the protective insulating film 118 is deposited (see FIG. 3C). The protective insulating film 118 can be deposited by a sputtering method, a CVD method, an MBE method, an ALD method, or a PLD method. A back gate electrode may be formed over the oxide semiconductor film 106 with the protective insulating film 118 provided therebetween. The description of the gate electrode 104 is referred to for the back gate electrode.

In this manner, the transistor in FIG. 1B can be manufactured.

The transistor in FIG. 1B has few oxygen vacancies in the oxide semiconductor film 106 and the vicinity of the oxide semiconductor film 106 and excellent electric characteristics. In addition, since change in electric characteristics due to operation of the transistor is suppressed, reliability of a semiconductor device including the transistor can be increased.

According to this embodiment, a transistor with excellent electric characteristics can be provided. Further, a highly reliable semiconductor device including the transistor can be provided.

This embodiment can be implemented in appropriate combination with any of the other embodiments.

Embodiment 2

In this embodiment, a transistor having a structure different from those of the transistors in Embodiment 1 will be described with reference to FIGS. 4A to 4C, FIGS. 5A to 5C, and FIGS. 6A to 6C.

Figure 4A:
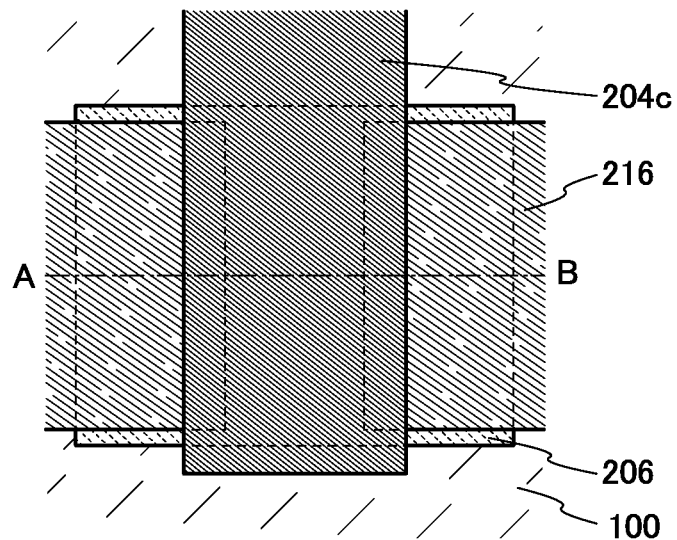
FIGS. 4A to 4C are a top view and cross-sectional views illustrating examples of a transistor according to one embodiment of the present invention.
Figure 4B:
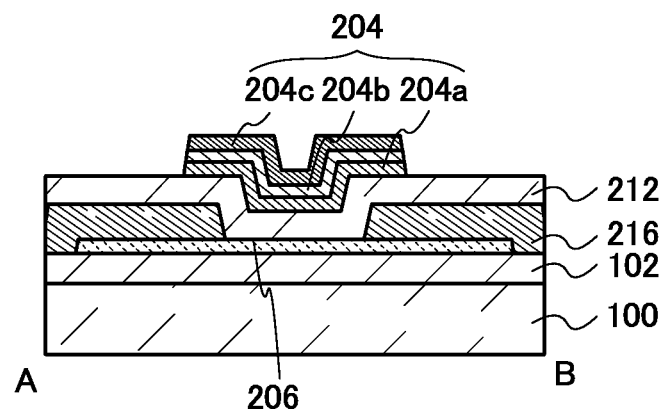

FIG. 4A is a top view of the transistor according to one embodiment of the present invention. FIG. 4B is a cross-sectional view along dashed-dotted line A-B in FIG. 4A. Note that for simplicity, a gate insulating film 212, the base insulating film 102, and the like are not shown in FIG. 4A.

The transistor in FIG. 4B includes the base insulating film 102 over the substrate 100; an oxide semiconductor film 206 over the base insulating film 102; a pair of electrodes 216 over the oxide semiconductor film 206; a gate insulating film 212 provided to cover the oxide semiconductor film 206 and the pair of electrodes 216; and a gate electrode 204 including a first layer 204a, a second layer 204b, and a third layer 204c provided to overlap with the oxide semiconductor film 206 with the gate insulating film 212 provided therebetween. The first layer 204a of the gate electrode 204 is in contact with the gate insulating film 212. The second layer 204b of the gate electrode 204 is provided over the first layer 204a. The third layer 204c of the gate electrode 204 is provided over the second layer 204b. A back gate electrode may be provided under the oxide semiconductor film 206 with the base insulating film 102 provided therebetween.

Here, the first layer 204a of the gate electrode 204 has lower oxygen concentration than the second layer 204b of the gate electrode 204. The third layer 204c of the gate electrode 204 has higher conductivity than the first layer 204a and the second layer 204b of the gate electrode 204.

The first layer 204a of the gate electrode 204 is formed using a substance having higher Gibbs free energy for oxidation than a substance of the gate insulating film 212. That is, the first layer 204a of the gate electrode 204 is more easily reduced than the gate insulating film 212. In other words, the first layer 204a of the gate electrode 204 is more hardly oxidized than the gate insulating film 212.

The description of the gate electrode 104 is referred to for the gate electrode 204.

The gate insulating film 212 has an oxygen-transmitting property. Specifically, the gate insulating film 212 is an insulating film having a film density of lower than 3.2 g/cm$^3$. The film through which oxygen atoms can pass is, although depending on the thickness of the gate insulating film 212, an insulating film having a diffusion coefficient of oxygen atoms of greater than or equal to $3\times10^{-16}$ cm$^2$/s, preferably greater than or equal to $1\times10^{-15}$ cm$^2$/s, more preferably greater than or equal to $8\times10^{-1}$ cm$^2$/s, at higher than or equal to 150° C. and lower than or equal to 450° C.

The description of the gate insulating film 112 is referred to for the gate insulating film 212.

The description in Embodiment 1 is referred to for the substrate 100 and the base insulating film 102.

The description of the oxide semiconductor film 106 is referred to for the oxide semiconductor film 206.

The description of the pair of electrodes 116 is referred to for the pair of electrodes 216. In this embodiment, the pair of electrodes 216 is in contact with an upper surface of the oxide semiconductor film 206; however, one embodiment of the present invention is not limited thereto. For example, the pair of electrodes 216 may be in contact with a lower surface of the oxide semiconductor film 206.

Figure 4C:
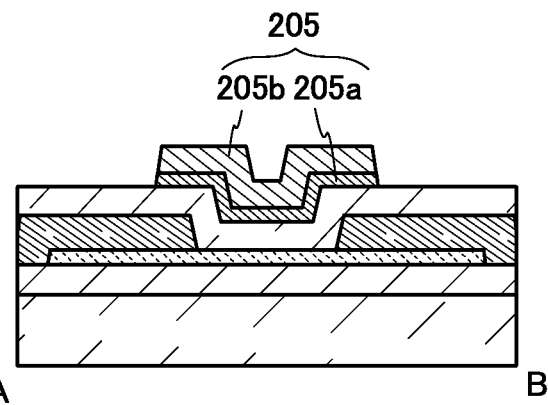

The transistor in FIG. 4C is different from the transistor in FIG. 4B in the structure of a gate electrode. Specifically, a gate electrode 205 of the transistor in FIG. 4C includes the first layer 205a and the second layer 205b which are similar to the first layer 204a and the second layer 204b of the gate electrode 204, respectively. That is, the gate electrode 205 has a structure in which the third layer 204c is omitted from the gate electrode 204. Consequently, although the gate electrode 205 has higher resistance than the gate electrode 204 because of the third layer 204c, formation thereof becomes easier.

A method for manufacturing the transistor in FIG. 4B is described below with reference to FIGS. 5A to 5C and FIGS. 6A to 6C.

Note that the description in Embodiment 1 is referred to for a manufacturing step up to the step of forming the base insulating film 102 over the substrate 100.

It is preferable that the base insulating film 102 be sufficiently flat. Thus, planarization treatment is preferably performed on the base insulating film 102. As the planarization treatment, chemical mechanical polishing (CMP) treatment or a dry etching method may be used. Specifically, the base insulating film 102 is provided so as to have an average surface roughness (Ra) of 1 nm or less, preferably 0.3 nm or less, further preferably 0.1 nm or less. When Ra is less than or equal to the above value, a crystal region is easily formed in the oxide semiconductor film. Further, when the degree of roughness at the interface between the base insulating film 102 and the oxide semiconductor film is small, the influence of interface scattering can be reduced. Note that Ra is obtained by expanding, into three dimensions, arithmetic mean surface roughness that is defined by JIS B 0601:2001 (ISO4287:1997) so as to be able to apply it to a curved surface. Ra can be expressed as an "average value of the absolute values of deviations from a reference surface to a specific surface" and is defined by Formula (3).

$$Ra = \frac{1}{S_0} \int_{y1}^{y2} \int_{x1}^{x2} |f(x, y) - Z_0| dx dy \tag{3}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). Ra can be measured using an atomic force microscope (AFM).

Figure 5A:
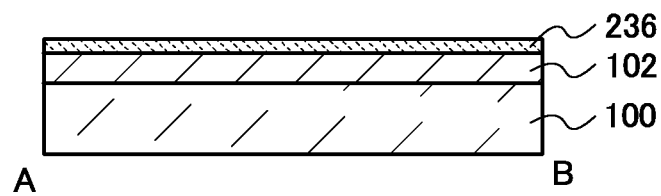
FIGS. 5A to 5C are cross-sectional views illustrating an example of a method for manufacturing a transistor according to one embodiment of the present invention.

Then, an oxide semiconductor film 236 is deposited (see FIG. 5A). The description of the oxide semiconductor film 136 is referred to for the oxide semiconductor film 236, and the oxide semiconductor film 236 can be deposited by a sputtering method, a CVD method, an MBE method, an ALD method, or a PLD method.

For the oxide semiconductor film 236, a sputtering method is preferably used. At this time, a deposition gas is used which includes an oxidizing gas at 5% or more, preferably 10% or more, further preferably 20% or more, still further preferably 50% or more. As the deposition gas, a gas in which the concentration of impurities such as hydrogen is low is used.

After the deposition of the oxide semiconductor film 236, first heat treatment may be performed. The first heat treatment may be performed at higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, preferably 1% or more, further preferably 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, preferably 1% or more, further preferably 10% or more in order to compensate oxygen which is desorbed. By the first heat treatment, impurities such as hydrogen and water can be removed from the oxide semiconductor film 236.

Figure 5B:
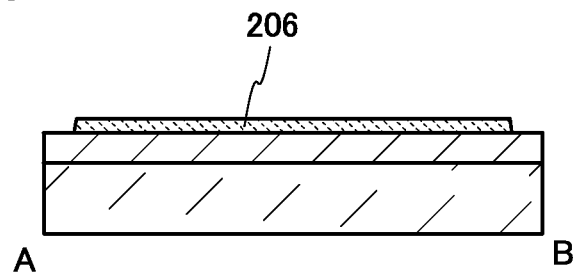
Figure 5C:
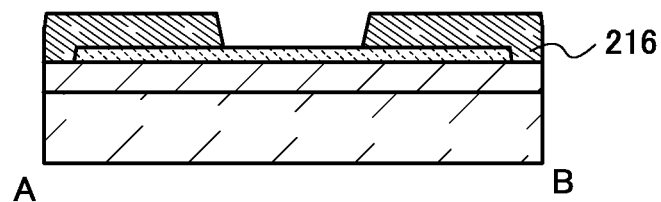

Next, the oxide semiconductor film 236 is processed to form the island-shaped oxide semiconductor film 206 (see FIG. 5B).

Next, a conductive film to be the pair of electrodes 216 is deposited. The description of the conductive film to be the pair of electrodes 116 is referred to for the conductive film to be the pair of electrodes 216, and the conductive film to be the pair of electrodes 216 can be deposited by a sputtering method, a CVD method, an MBE method, an AUD method, or a PLD method. Next, the conductive film to be the pair of electrodes 216 is processed into the pair of electrodes 216 (see FIG. 5C).

Next, the gate insulating film 212 is deposited. The description of the gate insulating film 112 is referred to for the gate insulating film 212, and the gate insulating film 212 can be deposited by a sputtering method, a CVD method, an MBE method, an ALD method, or a PLD method.

Figure 6A:
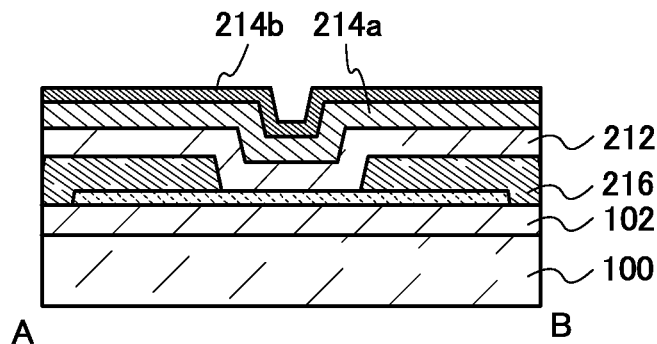
FIGS. 6A to 6C are cross-sectional views illustrating an example of a method for manufacturing a transistor according to one embodiment of the present invention.
Figure 6B:
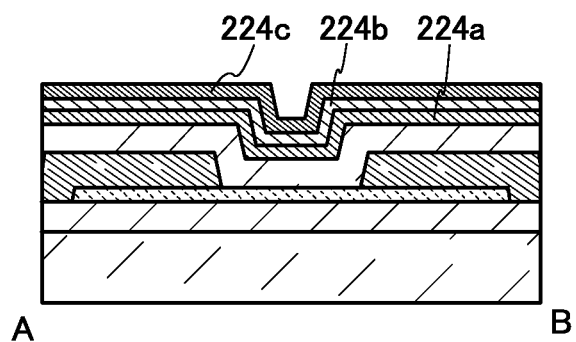

Next, the conductive film 214a and the conductive film 214b are deposited in this order (see FIG. 6A). The description of the conductive film 114a and the conductive film 114b is referred to for the conductive film 214a and the conductive film 214b, and the conductive film 214a and the conductive film 214b can be deposited by a sputtering method, a CVD method, an MBE method, an ALD method, or a PLD method. The conductive film 214a is a metal oxide film.

Next, second heat treatment is performed. The description of the heat treatment in Embodiment 1 can be referred to for the second heat treatment.

The conductive film 214a is reduced by the second heat treatment and oxygen generated by the reduction reaches into the oxide semiconductor film 206 and the vicinity of the oxide semiconductor film 206 through the gate insulating film 212, whereby oxygen vacancies in the oxide semiconductor film 206 and the vicinity of the oxide semiconductor film 206 can be reduced.

As described above, by reducing the conductive film 214a, the conductive film 224a having lower oxygen concentration than the conductive film 214a and the conductive film 224b having almost the same oxygen concentration as the conductive film 214a are formed. The conductive film 214b becomes the conductive film 224c without particular change (see FIG. 6B).

Figure 6C:
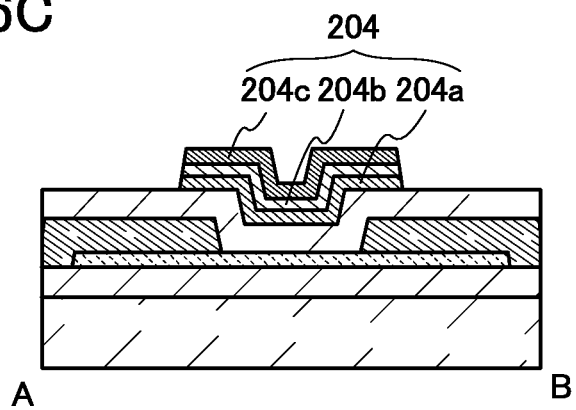

The conductive film 224a, the conductive film 224b, and the conductive film 224c are processed to form the first layer 204a, the second layer 204b, and the third layer 204c, whereby the gate electrode 204 is formed (see FIG. 6C).

Note that halogen and hydrogen in the oxide semiconductor film cause carriers in some cases. In the case where ruthenium or ruthenium oxide is used for the conductive film 214a, the conductive film 214a can be etched using neither halogen nor hydrogen. The conductive film 214a is etched without using halogen and hydrogen; thus, change in threshold voltage of the transistor can be suppressed.

In this manner, the transistor in FIG. 4B can be manufactured.

The transistor in FIG. 4B has few oxygen vacancies in the oxide semiconductor film 206 and the vicinity of the oxide semiconductor film 206 and excellent electric characteristics. In addition, since change in electric characteristics due to operation of the transistor is suppressed, reliability of a semiconductor device including the transistor can be increased.

According to this embodiment, a transistor with excellent electric characteristics can be provided. Further, a highly reliable semiconductor device including the transistor can be provided.

This embodiment can be implemented in appropriate combination with any of the other embodiments.

Embodiment 3

In this embodiment, a transistor having a structure different from those of the transistors in Embodiments 1 and 2 will be described with reference to FIGS. 7A and 7B, FIGS. 8A to 8C, FIGS. 9A to 9C, FIGS. 10A to 10C, and FIGS. 11A to 11C.

Figure 7A:
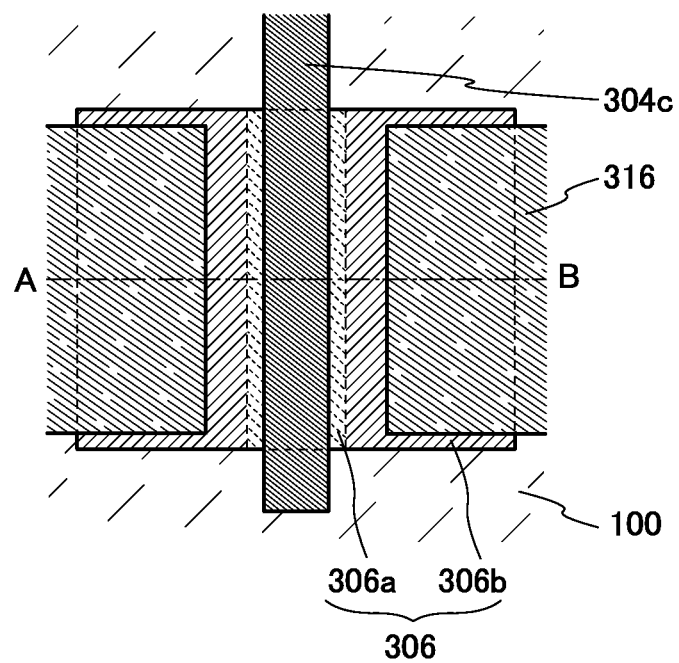
FIGS. 7A and 7B are a top view and a cross-sectional view illustrating an example of a transistor according to one embodiment of the present invention.
Figure 7B:
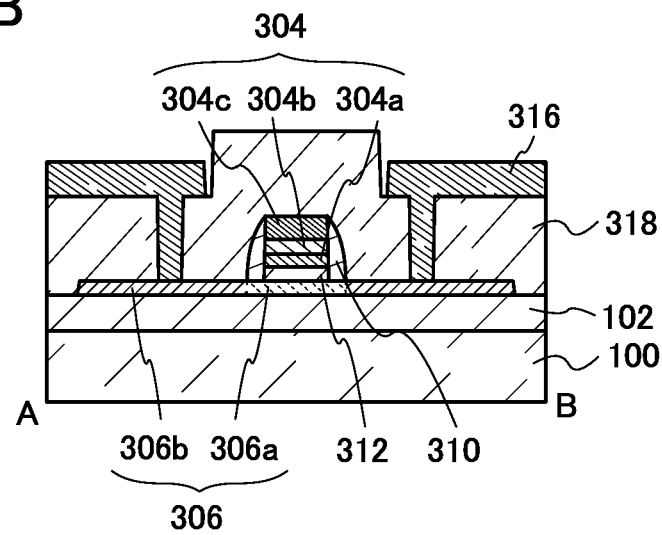

FIG. 7A is a top view of a transistor according to one embodiment of the present invention. FIG. 7B is a cross-sectional view along dashed-dotted line A-B in FIG. 7A. Note that for simplicity, a protective insulating film 318, the base insulating film 102, and the like are not shown in FIG. 7A.

The transistor in FIG. 7B includes the base insulating film 102 over the substrate 100; an oxide semiconductor film 306 including a first region 306a and a second region 306b over the base insulating film 102; a gate insulating film 312 over the oxide semiconductor film 306; a gate electrode 304 including a first layer 304a, a second layer 304b, and a third layer 304c and provided to overlap with the oxide semiconductor film 306 with the gate insulating film 312 provided therebetween; sidewall insulating films 310 provided to be in contact with side surfaces of the gate insulating film 312 and the gate electrode 304; a protective insulating film 318 provided to cover the sidewall insulating films 310, the gate electrode 304, and the oxide semiconductor film 306 and including an opening exposing part of the oxide semiconductor film 306; and a pair of electrodes 316 provided to be in contact with the second region 306b of the oxide semiconductor film 306 through the opening of the protective insulating film 318. The first layer 304a of the gate electrode 304 is in contact with the gate insulating film 312. The second layer 304b of the gate electrode 304 is provided over the first layer 304a. The third layer 304c of the gate electrode 304 is provided over the second layer 304b. The first region 306a of the oxide semiconductor film 306 is provided in a region overlapping with the gate electrode 304 and the sidewall insulating films 310. A back gate electrode may be provided under the oxide semiconductor film 306 with the base insulating film 102 provided therebetween.

Here, the first layer 304a of the gate electrode 304 has lower oxygen concentration than the second layer 304b of the gate electrode 304. The third layer 304c of the gate electrode 304 has higher conductivity than the first layer 304a and the second layer 304b of the gate electrode 304.

The first layer 304a of the gate electrode 304 is formed using a substance having higher Gibbs free energy for oxidation than a substance of the gate insulating film 312. That is, the first layer 304a of the gate electrode 304 is more easily reduced than the gate insulating film 312. In other words, the first layer 304a of the gate electrode 304 is more hardly oxidized than the gate insulating film 312.

The description of the gate electrode 104 is referred to for the gate electrode 304.

The gate insulating film 312 has an oxygen-transmitting property. Specifically, the gate insulating film 312 is an insulting film having a film density of lower than 3.2 g/cm$^3$. The film through which oxygen atoms can pass is, although depending on the thickness of the gate insulating film 312, an insulating film having a diffusion coefficient of oxygen atoms of greater than or equal to $3 \times 10^{-16}$ cm$^2$/s, preferably greater than or equal to $1 \times 10^{-15}$ cm$^2$/s, more preferably greater than or equal to $8 \times 10^{-15}$ cm$^2$/s, at higher than or equal to 150° C. and lower than or equal to 450° C.

The description of the gate insulating film 112 is referred to for the gate insulating film 312.

Note that the gate insulating film 312 has a top surface shape similar to that of the gate electrode 304 in FIG. 7B; however, one embodiment of the present invention is not limited thereto. For example, the gate insulating film 312 may have a top surface shape similar to that of a combination of the gate electrode 304 and the sidewall insulating film 310.

With the above-described gate electrode 304 and gate insulating film 312, oxygen can be supplied from the gate electrode 304 to the oxide semiconductor film 306 through the gate insulating film 312. Accordingly, oxygen vacancies in the oxide semiconductor film 306 and the vicinity of the oxide semiconductor film 306 are reduced. Thus, change in electric characteristics of the transistor due to oxygen vacancies in the oxide semiconductor film 306 and the vicinity of the oxide semiconductor film 306 can be suppressed.

The sidewall insulating film 310 is an insulating film having a low oxygen-transmitting property. An insulating film having a low oxygen-transmitting property is an insulating film through which oxygen molecules do not pass, or a film which has a sufficiently low diffusion coefficient of oxygen atoms and through which oxygen atoms do not pass by heat treatment or the like in a manufacturing process. For example, a film through which oxygen molecules do not pass has high density such that oxygen molecules do not pass through the film. Specifically, the film density is preferably higher than or equal to 3.2 g/cm$^3$. A diffusion coefficient of oxygen atoms in the film through which oxygen atoms do not pass at higher than or equal to 150° C. and lower than or equal to 450° C., although depending on the thickness of the sidewall insulating film 310, is less than $3 \times 10^{-16}$ cm$^2$/s, preferably less than $1 \times 10^{-16}$ cm$^2$/s, more preferably less than $5 \times 10^{-17}$ cm$^2$/s.

With the sidewall insulating film 310 having a low oxygen-transmitting property, outward diffusion of oxygen that is released from the gate electrode 304 is reduced and oxygen can be efficiently supplied to the oxide semiconductor film 306 and the vicinity of the oxide semiconductor film 306.

The sidewall insulating film 310 is provided in this embodiment; however, one embodiment of the present invention is not limited thereto. For example, the sidewall insulating film 310 may be omitted.

The description in Embodiment 1 is referred to for the substrate 100 and the base insulating film 102.

The first region 306a of the oxide semiconductor film 306 serves as a channel region of the transistor. The second regions 306b of the oxide semiconductor film 306 serve as a source region and a drain region of the transistor.

The description of the oxide semiconductor film 106 is referred to for the oxide semiconductor film 306.

The description of the protective insulating film 118 is referred to for the protective insulating film 318.

The description of the pair of electrodes 116 is referred to for the pair of electrodes 316.

A method for manufacturing the transistor in FIG. 7B is described below with reference to FIGS. 8A to 8C and FIGS. 9A to 9C.

Figure 8A:
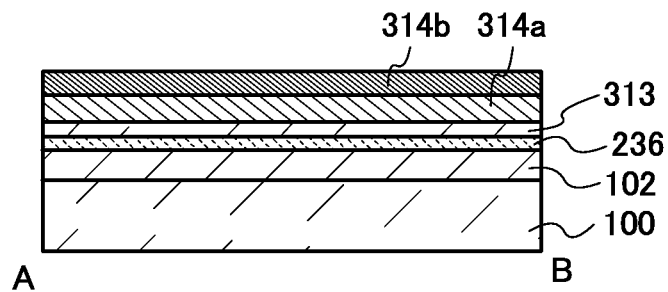
FIGS. 8A to 8C are cross-sectional views illustrating an example of a method for manufacturing a transistor according to one embodiment of the present invention.
Figure 8B:
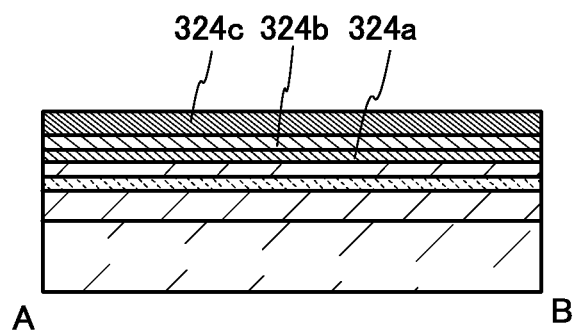

Note that the description in Embodiments 1 and 2 is referred to for a manufacturing method up to the steps of forming the base insulating film 102 over the substrate 100, depositing the oxide semiconductor film 236 over the base insulating film 102, and performing the first heat treatment, which are shown in FIG. 8A.

Next, a gate insulating film 313 is deposited. The gate insulating film 112 is referred to for the gate insulating film 313, and the gate insulating film 313 can be deposited by a sputtering method, a CVD method, an MBE method, an ALD method, or a PLD method.

Next, the conductive film 314a and the conductive film 314b are deposited in this order (see FIG. 8A). The description of the conductive film 114a and the conductive film 114b is referred to for the conductive film 314a and the conductive film 314b, and the conductive film 314a and the conductive film 314b can be deposited by a sputtering method, a CVD method, an MBE method, an ALD method, or a PLD method.

Next, second heat treatment is performed. The description of the heat treatment in Embodiment 1 can be referred to for the second heat treatment.

The conductive film 314a is reduced by the second heat treatment and oxygen generated by the reduction reaches into the oxide semiconductor film 306 and the vicinity of the oxide semiconductor film 306 through the gate insulating film 313, whereby oxygen vacancies in the oxide semiconductor film 306 and the vicinity of the oxide semiconductor film 306 can be reduced.

As described above, by reducing the conductive film 314a, the conductive film 324a having lower oxygen concentration than the conductive film 314a and the conductive film 324b having almost the same oxygen concentration as the conductive film 314a are formed. The conductive film 314b becomes the conductive film 324c without particular change (see FIG. 8B).

The conductive film 324a, the conductive film 324b, and the conductive film 324c are processed to form the first layer 304a, the second layer 304b, and the third layer 304c, whereby the gate electrode 304 is formed.

Note that halogen and hydrogen in the oxide semiconductor film cause carriers in some cases. In the case where ruthenium or ruthenium oxide is used for the conductive film 324a, the conductive film 324a can be etched using neither halogen nor hydrogen. The conductive film 324a is etched without using halogen and hydrogen; thus, change in threshold voltage of the transistor can be suppressed.

Figure 8C:
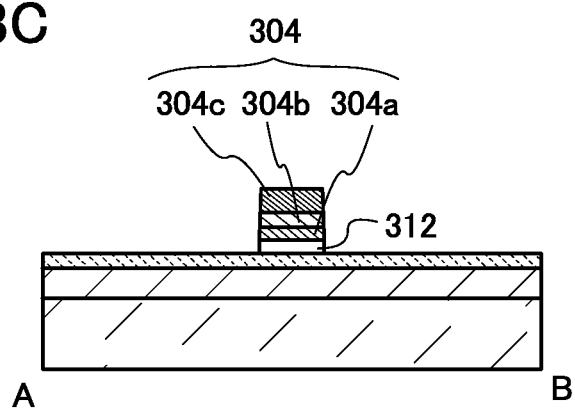

Next, the gate insulating film 313 is processed, whereby the gate insulating film 312 having a top surface shape similar to that of the gate electrode 304 is formed (see FIG. 8C). The gate insulating film 313 may be processed using the resist mask which is used for the formation of the gate electrode 304. Alternatively, the gate insulating film 313 may be processed using the gate electrode 304 as a mask after the resist mask is removed. In such a manner, part of a surface of the oxide semiconductor film 236 is exposed.

Here, a manufacturing process of a transistor described below may proceed without processing of the gate insulating film 313.

Next, an insulating film to be the sidewall insulating films 310 is deposited. The insulating film to be the sidewall insulating films 310 can be deposited by a sputtering method, a CVD method, an MBE method, an ALD method, or a PLD method. Then, highly anisotropic etching treatment is performed on the insulating film to be the sidewall insulating films 310, whereby the sidewall insulating films 310 which are in contact with side surfaces of the gate insulating film 312 and the gate electrode 304 can be formed (see FIG. 9A). In the case where the manufacturing process of the transistor proceeds without the processing of the gate insulating film 313, the gate insulating film 312 is formed while the sidewall insulating films 310 are formed. Thus, a gate insulating film overlapping with the gate electrode 304 and the sidewall insulating films 310 is formed. Further, the sidewall insulating films 310 are in contact with the side surfaces of the gate electrode 304.

Next, the oxide semiconductor film 236 is processed to form an island-shaped oxide semiconductor film. Then, impurities are added to the island-shaped oxide semiconductor film by using the sidewall insulating films 310 and the gate electrode 304 as a mask. The impurity is an impurity which reduces the resistance of the oxide semiconductor film. Specifically, one or more of helium, boron, nitrogen, fluorine, neon, aluminum, phosphorus, argon, arsenic, krypton, indium, tin, antimony, and xenon can be added. The method for adding the impurities can be an ion implantation method or an ion doping method. Alternatively, plasma treatment or heat treatment may be performed in an atmosphere including the impurities that reduce the resistance of the oxide semiconductor film. Preferably, an ion implantation method is used. After adding the impurities that reduce the resistance of the oxide semiconductor film by an ion implantation method, third heat treatment may be performed. In this embodiment, the impurities are added to the island-shaped oxide semiconductor film after the sidewall insulating films 310 are formed; however, the impurities may be added to the island-shaped oxide semiconductor film before the sidewall insulating films 310 are formed. In that case, the impurities may be added to the island-shaped oxide semiconductor film through the gate insulating film 313. Alternatively, the impurities may be added to the island-shaped oxide semiconductor film after the gate insulating film 313 is processed and the gate insulating film 312 having a top surface shape similar to that of the gate electrode 304 is formed. After that, the sidewall insulating films 310 can be formed. When the impurities are added to the island-shaped oxide semiconductor film in such a manner, regions of the island-shaped oxide semiconductor film which overlap with the sidewall insulating films 310 become low-resistance regions.

The resistance of the regions to which the impurities are added is reduced, and the regions become the second regions 306b. A region to which the impurity is not added becomes the first region 306a without particular change. Thus, the oxide semiconductor film 306 including the first region 306a and the second regions 306b is formed (see FIG. 9B).

Then, the protective insulating film 318 is deposited over the sidewall insulating films 310, the oxide semiconductor film 306, and the gate electrode 304. The description of the protective insulating film 118 is referred to for the protective insulating film 318, and the protective insulating film 318 can be deposited by a sputtering method, a CVD method, an MBE method, an ALD method, or a PLD method.

Then, the protective insulating film 318 is processed, so that a pair of openings exposing the second regions 306b of the oxide semiconductor film 306 is formed. The formation of the openings is performed under conditions which prevent etching of the oxide semiconductor film 306 as much as possible. However, one embodiment of the present invention is not limited thereto. Specifically, when the openings are formed, parts of surfaces of the second regions 306b of the oxide semiconductor film 306 may be etched, or the openings may penetrate the second regions 306b to expose the base insulating film 102.

Next, over the protective insulating film 318 and the exposed oxide semiconductor film 306, a conductive film to be the pair of electrodes 316 is deposited. The conductive film can be deposited by a sputtering method, a CVD method, an MBE method, an ALD method, or a PLD method.

Figure 9A:
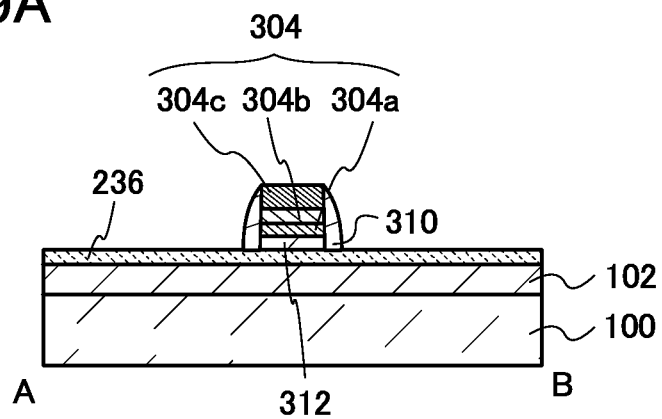
FIGS. 9A to 9C are cross-sectional views illustrating an example of a method for manufacturing a transistor according to one embodiment of the present invention.
Figure 9B:
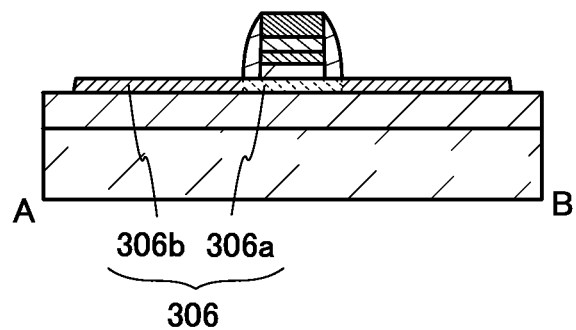
Figure 9C:
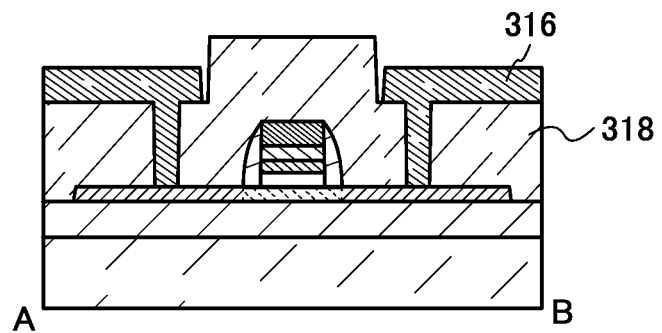

Then, the conductive film to be the pair of electrodes 316 is processed into the pair of electrodes 316 (see FIG. 9C).

In this manner, the transistor in FIG. 7B can be manufactured.

A method for manufacturing the transistor in FIG. 7B, which is different from the manufacturing method in FIGS. 8A to 8C and FIGS. 9A to 9C, is described with reference to FIGS. 10A to 10C and FIGS. 11A to 11C.

Figure 10A:
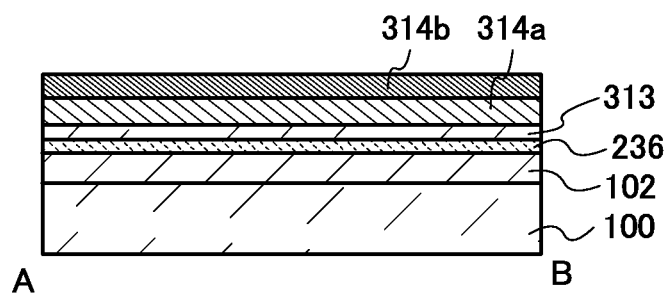
FIGS. 10A to 10C are cross-sectional views illustrating an example of a method for manufacturing a transistor according to one embodiment of the present invention.

Note that FIG. 10A is a cross-sectional view similar to that in FIG. 8A. Therefore, the description of up to the step in FIG. 8A can be referred to for description of up to the step in FIG. 10A.

Next, the conductive film 314a and the conductive film 314b are processed, whereby a conductive film 334a and a conductive film 334b which have top surface shapes similar to that of the gate electrode are formed.

Note that halogen and hydrogen in the oxide semiconductor film cause carriers in some cases. In the case where ruthenium or ruthenium oxide is used for the conductive film 334a, the conductive film 334a can be etched using neither halogen nor hydrogen. The conductive film 334a is etched without using halogen and hydrogen; thus, change in threshold voltage of the transistor can be suppressed.

Figure 10B:
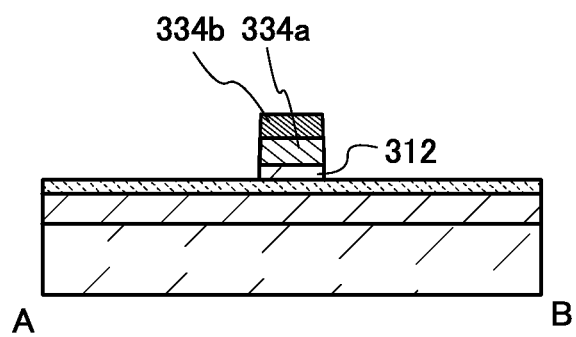
Figure 10C:
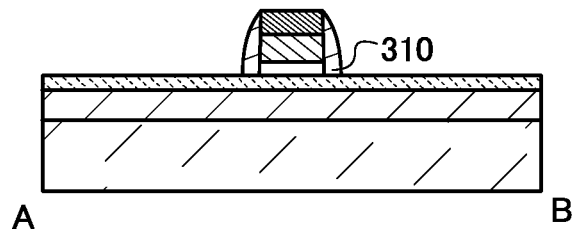
Figure 11A:
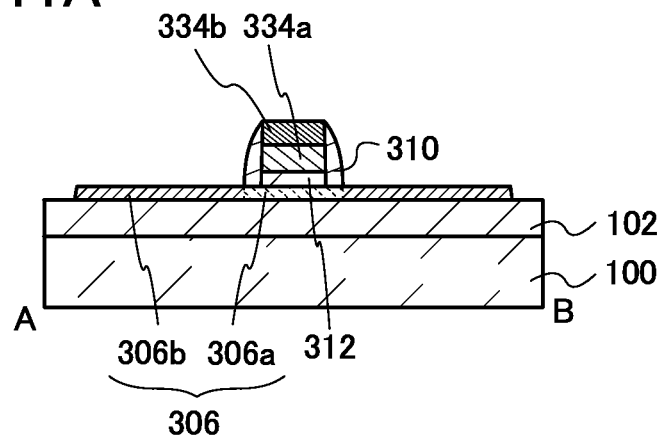
FIGS. 11A to 11C are cross-sectional views illustrating an example of a method for manufacturing a transistor according to one embodiment of the present invention.
Figure 11B:
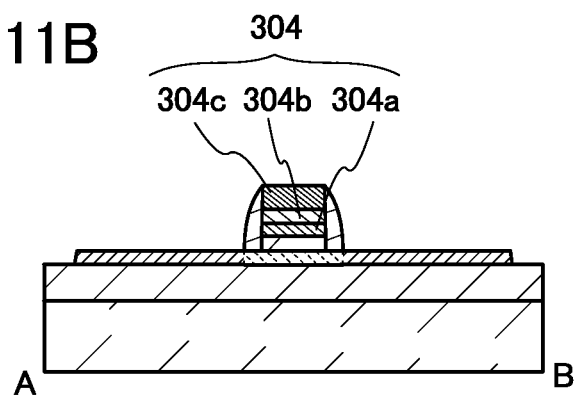
Figure 11C:
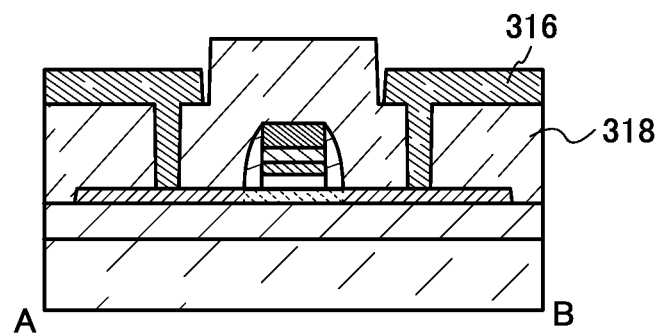

Next, the gate insulating film 313 is processed, whereby the gate insulating film 312 having a top surface shape similar to that of the gate electrode is formed (see FIG. 10B). The gate insulating film 313 may be processed using the resist mask which is used for the processing of the conductive film 314a and the conductive film 314b. Alternatively, the gate insulating film 313 may be processed using the conductive film 334a and the conductive film 334b as a mask after the resist mask is removed. In such a manner, part of the surface of the oxide semiconductor film 236 is exposed.

Here, a manufacturing process of a transistor described below may proceed without processing of the gate insulating film 313.

Next, an insulating film to be the sidewall insulating films 310 is deposited. The insulating film to be the sidewall insulating films 310 can be deposited by a sputtering method, a CVD method, an MBE method, an ALD method, or a PLD method. Then, highly anisotropic etching treatment is performed on the insulating film to be the sidewall insulating films 310, whereby the sidewall insulating films 310 which are in contact with side surfaces of the gate insulating film 312, the conductive film 334a, and the conductive film 334b can be formed (see FIG. 10C).

Next, the oxide semiconductor film 236 is processed to form an island-shaped oxide semiconductor film. Then, impurities are added to the island-shaped oxide semiconductor film by using the sidewall insulating films 310, the gate insulating film 312, the conductive film 334a, and the conductive film 334b as a mask. The description of the impurities in FIGS. 9A and 9B can be referred to for the impurities.

The resistance of the regions to which the impurities are added is reduced, and the regions become the second regions 306b. A region to which the impurity is not added becomes the first region 306a without particular change. Thus, the oxide semiconductor film 306 including the first region 306a and the second regions 306b is formed (see FIG. 11A).

Next, second heat treatment is performed.

The conductive film 334a is reduced by the second heat treatment and oxygen generated by the reduction reaches into the oxide semiconductor film 306 and the vicinity of the oxide semiconductor film 306 through the gate insulating film 312, whereby oxygen vacancies in the oxide semiconductor film 306 and the vicinity of the oxide semiconductor film 306 can be reduced.

As described above, by reducing the conductive film 334a, the first layer 304a having lower oxygen concentration than the conductive film 334a and the second layer 304b having almost the same oxygen concentration as the conductive film 334a are formed. The conductive film 334b becomes the third layer 304c without particular change. Thus, the gate electrode 304 including the first layer 304a, the second layer 304b, and the third layer 304c is formed (see FIG. 11B).

Then, the protective insulating film 318 is deposited over the sidewall insulating films 310, the oxide semiconductor film 306, and the gate electrode 304.

Then, the protective insulating film 318 is processed, so that a pair of openings exposing the second regions 306b of the oxide semiconductor film 306 is formed. The formation of the openings is performed under conditions which prevent etching of the oxide semiconductor film 306 as much as possible. However, one embodiment of the present invention is not limited thereto. Specifically, when the openings are formed, parts of surfaces of the second regions 306b of the oxide semiconductor film 306 may be etched, or the openings may penetrate the second regions 306b to expose the base insulating film 102.

Next, over the protective insulating film 318 and the exposed oxide semiconductor film 306, a conductive film to be the pair of electrodes 316 is deposited. Then, the conductive film to be the pair of electrodes 316 is processed into the pair of electrodes 316 (see FIG. 11C).

In this manner, the transistor in FIG. 7B can be manufactured.

The transistor in FIG. 7B has few oxygen vacancies in the oxide semiconductor film 306 and the vicinity of the oxide semiconductor film 306 and excellent electric characteristics. In addition, since change in electric characteristics due to operation of the transistor is suppressed, reliability of a semiconductor device including the transistor can be increased.

According to this embodiment, a transistor with excellent electric characteristics can be provided. Further, a highly reliable semiconductor device including the transistor can be provided.

This embodiment can be implemented in appropriate combination with any of the other embodiments.

Embodiment 4

In this embodiment, a transistor having a structure different from those of the transistors described in Embodiments 1 to 3 will be described with reference to FIGS. 12A and 12B.

Figure 12A:
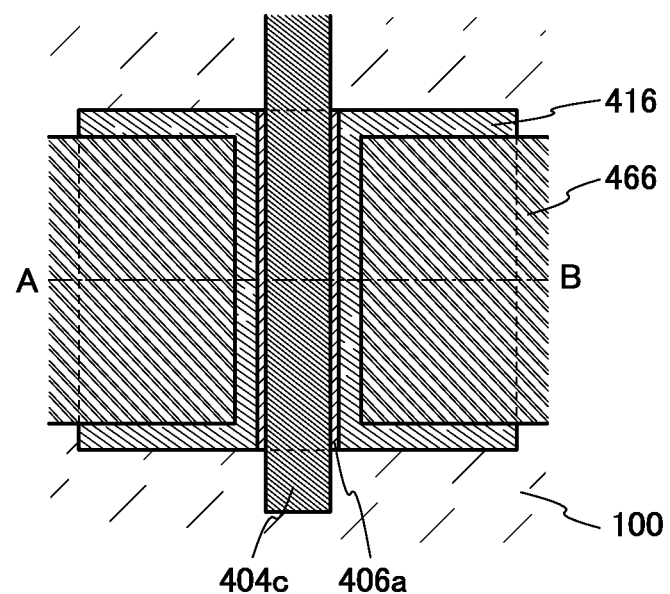
FIGS. 12A and 12B are a top view and a cross-sectional view illustrating an example of a transistor according to one embodiment of the present invention.

FIG. 12A is a top view of the transistor according to one embodiment of the present invention. FIG. 12B is a cross-sectional view along dashed-dotted line A-B in FIG. 12A. Note that for simplicity, a protective insulating film 418, the base insulating film 102, and the like are not shown in FIG. 12A.

Figure 12B:
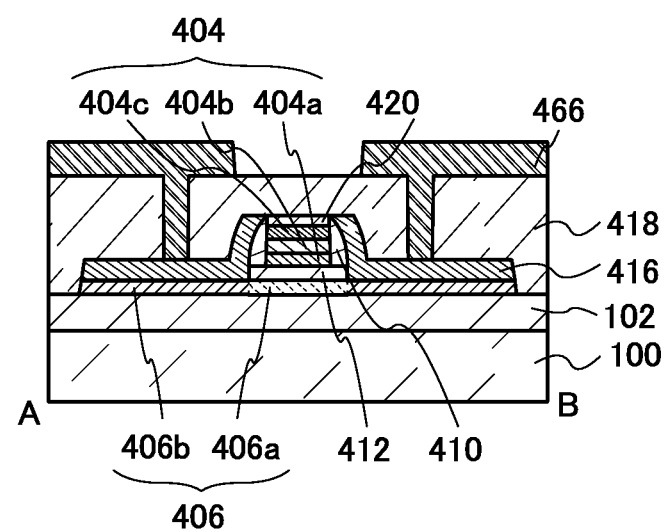

The transistor in FIG. 12B includes the base insulating film 102 over the substrate 100; an oxide semiconductor film 406 including a first region 406a and second regions 406b over the base insulating film 102; a gate insulating film 412 over the oxide semiconductor film 406; a gate electrode 404 including a first layer 404a, a second layer 404b, and a third layer 404c and overlapping with the oxide semiconductor film 406 with the gate insulating film 412 provided therebetween; an insulating film 420 over the third layer 404c of the gate electrode 404; sidewall insulating films 410 provided to be in contact with side surfaces of the gate insulating film 412, the gate electrode 404, and the insulating film 420; a pair of electrodes 416 provided to be in contact with the second regions 406b of the oxide semiconductor film 406 and the sidewall insulating films 410; a protective insulating film 418 provided to cover the pair of electrodes 416, the insulating film 420, the sidewall insulating films 410, the gate electrode 404, and the oxide semiconductor film 406 and including openings exposing parts of the pair of electrodes 416; and a pair of wirings 466 provided to be in contact with the pair of electrodes 416 through the openings of the protective insulating film 418. The first layer 404a of the gate electrode 404 is in contact with the gate insulating film 412. The second layer 404b of the gate electrode 404 is provided over the first layer 404a. The third layer 404c of the gate electrode 404 is provided over the second layer 404b. The first region 406a of the oxide semiconductor film 406 is provided in a region overlapping with the gate electrode 404 and the sidewall insulating films 410. A back gate electrode may be provided under the oxide semiconductor film 406 with the base insulating film 102 provided therebetween.

Here, the first layer 404a of the gate electrode 404 has lower oxygen concentration than the second layer 404b of the gate electrode 404. The third layer 404c of the gate electrode 404 has higher conductivity than the first layer 404a and the second layer 404b of the gate electrode 404.

The first layer 404a of the gate electrode 404 is formed using a substance having higher Gibbs free energy for oxidation than a substance of the gate insulating film 412. That is, the first layer 404a of the gate electrode 404 is more easily reduced than the gate insulating film 412. In other words, the first layer 404a of the gate electrode 404 is more hardly oxidized than the gate insulating film 412.

The description of the gate electrode 104 is referred to for the gate electrode 404.

The gate insulating film 412 has an oxygen-transmitting property.

Specifically, the gate insulating film 412 is an insulating film having a film density of lower than 3.2 g/cm$^3$. The film through which oxygen atoms can pass is, although depending on the thickness of the gate insulating film 412, an insulating film having a diffusion coefficient of oxygen atoms of greater than or equal to $3 \times 10^{-16}$ cm$^2$/s, preferably greater than or equal to $1 \times 10^{-15}$ cm$^2$/s, more preferably greater than or equal to $8 \times 10^{-15}$ cm$^2$/s, at higher than or equal to 150° C. and lower than or equal to 450° C.

The description of the gate insulating film 112 is referred to for the gate insulating film 412.

Note that the gate insulating film 412 has a top surface shape similar to that of a combination of the gate electrode 404 and the sidewall insulating films 410 in FIG. 12B;

however, one embodiment of the present invention is not limited thereto. For example, the gate insulating film 412 has a top surface shape similar to that of the gate electrode 404.

With the above-described gate electrode 404 and gate insulating film 412, oxygen can be supplied from the gate electrode 404 to the oxide semiconductor film 406 through the gate insulating film 412. Accordingly, oxygen vacancies in the oxide semiconductor film 406 and the vicinity of the oxide semiconductor film 406 are reduced. Thus, change in electric characteristics of the transistor due to oxygen vacancies in the oxide semiconductor film 406 and the vicinity of the oxide semiconductor film 406 can be suppressed.

The sidewall insulating film 410 is an insulating film having a low oxygen-transmitting property. An insulating film having a low oxygen-transmitting property is an insulating film through which oxygen molecules do not pass, or a film which has a sufficiently low diffusion coefficient of oxygen atoms and through which oxygen atoms do not pass by heat treatment or the like in a manufacturing process. For example, a film through which oxygen molecules do not pass has high density such that oxygen molecules do not pass through the film. Specifically, the film density is preferably higher than or equal to 3.2 g/cm$^3$. A diffusion coefficient of oxygen atoms in the film through which oxygen atoms do not pass at higher than or equal to 150° C. and lower than or equal to 450° C., although depending on the thickness of the sidewall insulating film 410, is less than $3\times10^{-16}$ cm$^2$/s, preferably less than $1\times10^{-16}$ cm$^2$ more preferably less than $5\times10^{-17}$ cm$^2$.

With the sidewall insulating film 410 having a low oxygen-transmitting property, outward diffusion of oxygen that is released from the gate electrode 404 is reduced and oxygen can be efficiently supplied to the oxide semiconductor film 406 and the vicinity of the oxide semiconductor film 406.

The insulating film 420 is provided so that the pair of electrodes 416 is not in contact with the gate electrode 404. The description of the base insulating film 102 is referred to for the insulating film 420.

The description in Embodiment 1 is referred to for the substrate 100 and the base insulating film 102.

The first region 406a of the oxide semiconductor film 406 serves as a channel region of the transistor. The second regions 406b of the oxide semiconductor film 406 serve as a source region and a drain region of the transistor.

The description of the oxide semiconductor film 106 is referred to for the oxide semiconductor film 406.

The description of the protective insulating film 118 is referred to for the protective insulating film 418.

The description of the pair of electrodes 116 is referred to for the pair of electrodes 416 and the pair of wirings 466.

The transistor in FIG. 12B can have high on-state characteristics because the pair of electrodes 416 can have lower resistance than the low-resistance regions of the oxide semiconductor film 406.

The transistor in FIG. 12B has few oxygen vacancies in the oxide semiconductor film 406 and the vicinity of the oxide semiconductor film 406 and excellent electric characteristics. In addition, since change in electric characteristics due to operation of the transistor is suppressed, reliability of a semiconductor device including the transistor can be increased.

According to this embodiment, a transistor with excellent electric characteristics can be provided. Further, a highly reliable semiconductor device including the transistor can be provided.

This embodiment can be implemented in appropriate combination with any of the other embodiments.

Embodiment 5

In this embodiment, a liquid crystal display device manufactured using the transistor described in any of Embodiments 1 to 4 will be described. Note that although an example in which one embodiment of the present invention is applied to a liquid crystal display device is described in this embodiment, one embodiment of the present invention is not limited thereto. For example, application of one embodiment of the present invention to an electroluminescence (EL) display device, which is one of light-emitting devices, is readily conceived by those skilled in the art.

FIG. 13 is a circuit diagram of an active matrix liquid crystal display device. The liquid crystal display device includes source lines SL_1 to SL_a, gate lines GL_1 to GL_b, and a plurality of pixels 2200. Each pixel 2200 includes a transistor 2230, a capacitor 2220, and a liquid crystal element 2210. The plurality of pixels 2200 with such a structure forms a pixel portion of the liquid crystal display device. In the case where the source line or the gate line is simply mentioned, it may be denoted as the source line SL or the gate line GL.

The transistor described in any of Embodiments 1 to 4 is used as the transistor 2230. Since the transistor described in any of Embodiments 1 to 4 is a transistor including an oxide semiconductor with favorable electric characteristics, a display device having high display quality can be obtained.

The gate line GL is connected to a gate of the transistor 2230, the source line SL is connected to a source of the transistor 2230, and a drain of the transistor 2230 is connected to one of capacitor electrodes of the capacitor 2220 and one of pixel electrodes of the liquid crystal element 2210. The other of the capacitor electrodes of the capacitor 2220 and the other of the pixel electrodes of the liquid crystal element 2210 are each connected to a common electrode. Note that the common electrode may be formed in the same layer as the gate line GL.

Further, the gate line GL is connected to a gate driver circuit. The gate driver circuit may include the transistor described in any of Embodiments 1 to 4.

The source line SL is connected to a source driver circuit. The source driver circuit may include the transistor described in any of Embodiments 1 to 4.

Note that either or both of the gate driver circuit and the source driver circuit may be formed over a separately prepared substrate and connected using a method such as chip on glass (COG), wire bonding, or tape automated bonding (TAB).

Since a transistor is easily broken by static electricity or the like, a protection circuit is preferably provided. The protection circuit is preferably formed using a nonlinear element.

When a voltage that is higher than or equal to the threshold voltage of the transistor 2230 is applied to the gate line GL, electric charge supplied from the source line SL flows as a drain current of the transistor 2230 and is accumulated in the capacitor 2220. After charging for one row, the transistors 2230 in the row are turned off and voltage application from the source line SL stops; however, a necessary voltage can be kept by the electric charge accumulated in the capacitors 2220. Then, charging of the capacitors 2220 in the next row starts. In this manner, charging for the first row to the b-th row is carried out. A drain current is a current that flows from a drain to a source through a channel in a transistor. The drain current flows when a gate voltage is higher than the threshold voltage.

Note that the transistor 2230 has a low off-state current. Thus, the display rewriting frequency can be reduced in the case of an image with little motion (including a still image), which enables a further reduction in power consumption. In addition, the capacitance of the capacitor 2220 can be further reduced, so that power consumption needed for charging can be reduced.

The liquid crystal display device can be highly reliable because in the transistor 2230, change in electric characteristics which results from operation of the transistor is small.

In the above-described manner, according to one embodiment of the present invention, a highly reliable liquid crystal display device with high display quality and low power consumption can be provided.

This embodiment can be combined with any of the other embodiments as appropriate.

Embodiment 6

In this embodiment, an example of manufacturing a semiconductor memory device using the transistor described in any of Embodiments 1 to 4 will be described.

Typical examples of a volatile semiconductor memory device include a dynamic random access memory (DRAM) which stores data by selecting a transistor included in a memory element and accumulating an electric charge in a capacitor, and a static random access memory (SRAM) which holds stored data using a circuit such as a flip-flop.

Typical examples of a nonvolatile semiconductor memory device include a flash memory which has a node between a gate and a channel region of a transistor and stores data by holding an electric charge in the node.

The transistor described in any of Embodiments 1 to 4 can be applied to some of transistors included in the above-described semiconductor memory device.

Figure 14A:
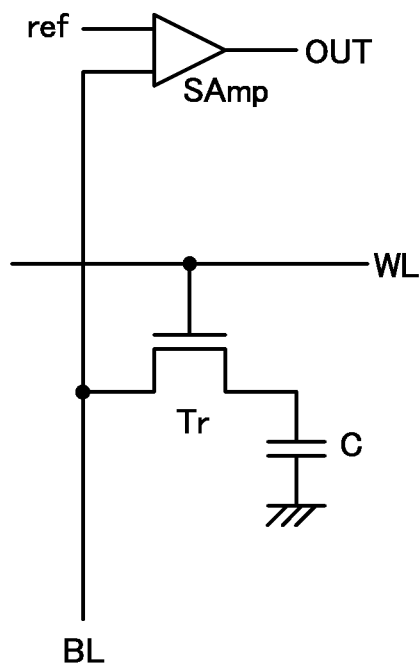
FIG. 14A is a circuit diagram illustrating an example of a semiconductor memory device according to one embodiment of the present invention and FIG. 14B shows electric characteristics thereof.

First, a memory cell included in a semiconductor memory device to which the transistor described in any of Embodiments 1 to 4 is applied will be described with reference to FIGS. 14A and 14B.

The memory cell includes a transistor Tr and a capacitor C. A gate of the transistor Tr is electrically connected to a word line WL. One of a source and a drain of the transistor Tr is electrically connected to a bit line BL. The other of the source and the drain of the transistor Tr is electrically connected to one terminal of the capacitor C. The other terminal of the capacitor C is grounded. The bit line BL is electrically connected to a sense amplifier SAmp (see FIG. 14A).

Figure 14B:
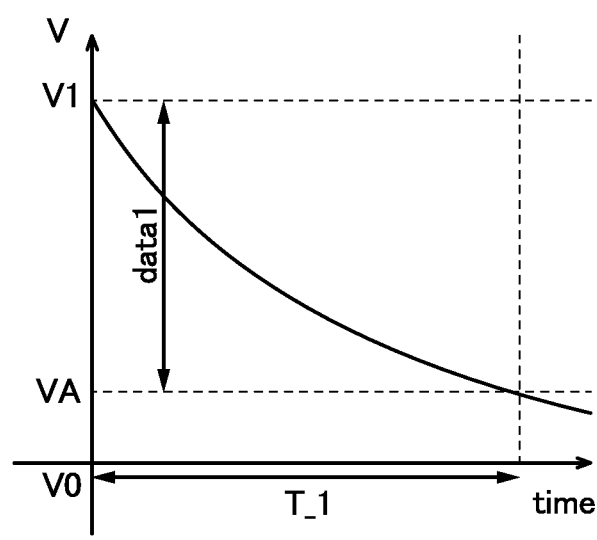

Note that it is known that the voltage held in the capacitor C is gradually decreased with time as shown in FIG. 14B owing to the off-state current of the transistor Tr. A voltage originally charged from V0 to V1 is decreased with time to VA that is a limit for reading out data 1. This period is called a holding period T_1. In the case of a two-level memory cell, refresh operation needs to be performed within the holding period T_1.

Here, when the transistor described in any of Embodiments 1 to 4 is used as the transistor Tr, the holding period T_1 can be increased because an off-state current of the transistor is low. That is, frequency of the refresh operation can be reduced; thus, power consumption can be reduced. For example, in the case where a memory cell is formed using a transistor that includes an oxide semiconductor film and has an off-state current of $1\times10^{-21}$ ampere (A) or lower, preferably $1\times10^{-24}$ ampere (A) or lower, data can be held for several days to several decades without supply of electric power.

When the transistor described in any of Embodiments 1 to 4, whose change in electric characteristics resulting from operation is small, is applied to the transistor Tr, the semiconductor memory device can be highly reliable.

As described above, according to one embodiment of the present invention, a semiconductor memory device including a memory cell with high reliability and low power consumption can be provided.

Next, as an example which is different from that in FIGS. 14A and 14B, a memory cell included in a semiconductor memory device to which the transistor described in any of Embodiments 1 to 4 is applied will be described with reference to FIGS. 15A and 15B.

Figure 15A:
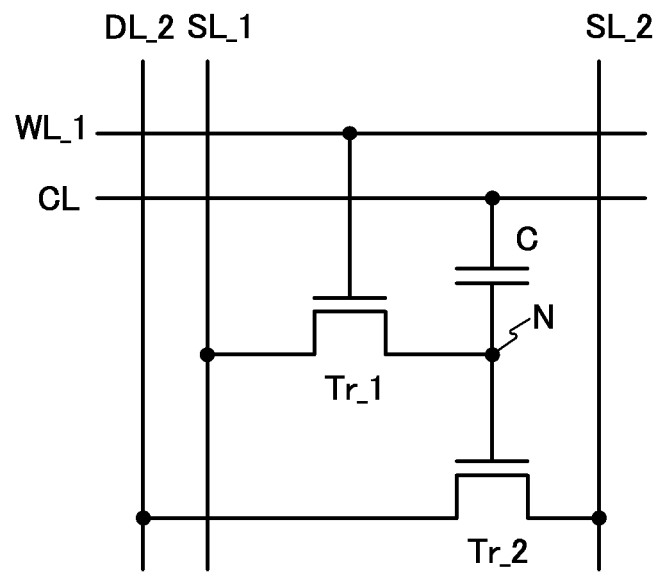
FIG. 15A is a circuit diagram illustrating an example of a semiconductor memory device according to one embodiment of the present invention and FIG. 15B shows electric characteristics thereof.
Figure 15B:
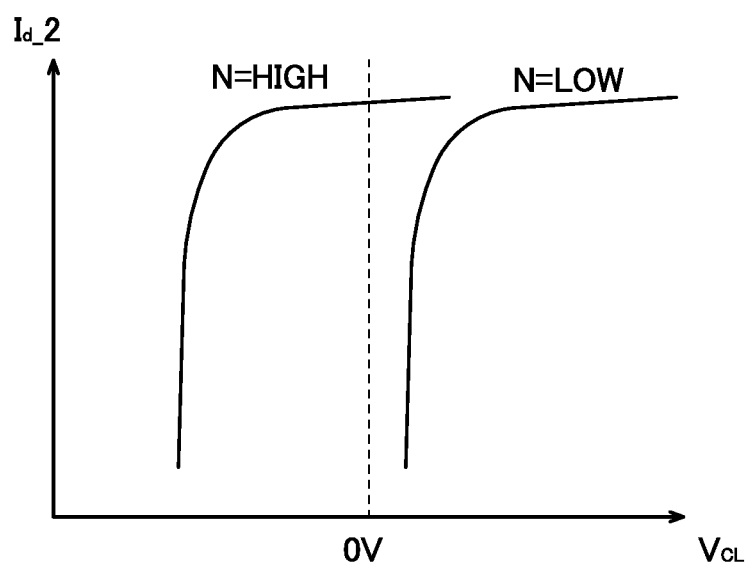

FIG. 15A is a circuit diagram of a memory cell and the periphery thereof. The memory cell includes a transistor Tr_1, a transistor Tr_2, and a capacitor C. A gate of the transistor Tr_1 is electrically connected to a word line WL_1. One of a source and a drain of the transistor Tr_1 is electrically connected to a source line SL_1. A gate of the transistor Tr_2 is electrically connected to the other of the source and the drain of the transistor Tr_1 and one terminal of the capacitor C to form a node N. One of a source and a drain of the transistor Tr_2 is electrically connected to a drain line DL_2. The other of the source and the drain of the transistor Tr_2 is electrically connected to a source line SL_2. The other terminal of the capacitor C is electrically connected to a capacitor line CL.

The non-volatile memory described in this embodiment utilizes change in the apparent threshold voltage of the transistor Tr_2, which is caused corresponding to the potential of the node N. For example, FIG. 15B shows a relation between a voltage $V_{CL}$ of the capacitor line CL and a drain current $I_d\_2$ flowing through the transistor Tr_2.

Here, the potential of the node N can be adjusted through the transistor Tr_1. For example, the potential of the source line SL_1 is set to VDD. In this case, when the potential of the word line WL_1 is set to be higher than or equal to a potential obtained by adding VDD to the threshold voltage Vth of the transistor Tr_1, the potential of the node N can be HIGH. Further, when the potential of the word line WL_1 is set to be lower than or equal to the threshold voltage Vth of the transistor Tr_1, the potential of the node N can be LOW.

Thus, either a $V_{CL}$-$I_d\_2$ curve (N=LOW) or a $V_{CL}$-$I_d\_2$ curve (N=HIGH) can be obtained. That is, when N=LOW, $I_d\_2$ is small at a $V_{CL}$ of 0 V; accordingly, data 0 is stored. Further, when N=HIGH, $I_d\_2$ is large at a $V_{CL}$ of 0 V; accordingly, data 1 is stored. In such a manner, data can be stored.

Here, when the transistor described in any of Embodiments 1 to 4 is used as the transistor Tr_1, the off-state current of the transistor can be extremely small; therefore, unintentional leakage of an electric charge accumulated in the node N by flowing between the source and the drain of the transistor Tr_1 can be suppressed. As a result, data can be held for a long time. Further, since the threshold voltage of the transistor Tr_1 in the memory cell included in the semiconductor memory device according to one embodiment of the present invention is adjusted, a voltage needed for writing can be low; thus, power consumption can be reduced as compared to a flash memory or the like.

When the transistor described in any of Embodiments 1 to 4, whose change in electric characteristics resulting from operation is small, is applied to the transistor Tr_1, the semiconductor memory device can be highly reliable.

Note that the transistor described in any of Embodiments 1 to 4 may be used as the transistor Tr_2.

As described above, according to one embodiment of the present invention, a semiconductor memory device with high reliability and low power consumption can be provided.

This embodiment can be combined with any of the other embodiments as appropriate.

Embodiment 7

A central processing unit (CPU) can be formed using the transistor described in any of Embodiments 1 to 4 or the semiconductor memory device described in Embodiment 6 for at least part of the CPU.

Figure 16A:
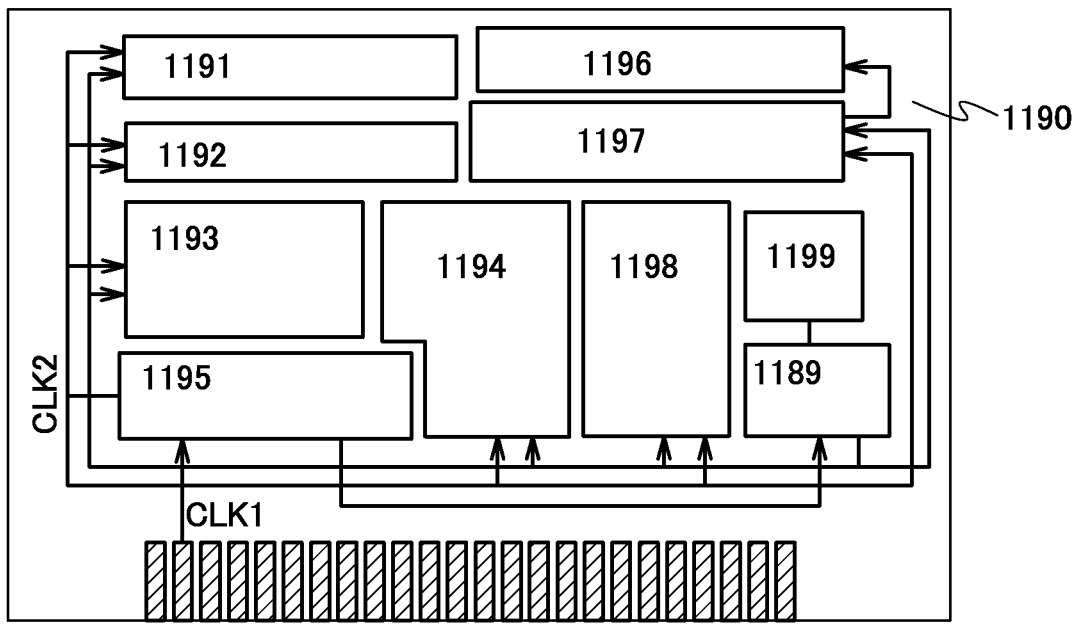
FIG. 16A is a block diagram illustrating a specific example of a CPU according to one embodiment of the present invention.

FIG. 16A is a block diagram illustrating a specific structure of the CPU. The CPU illustrated in FIG. 16A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable read only memory (rewritable ROM) 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 16A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 16A, a memory element is provided in the register 1196. As the memory element in the register 1196, for example, the semiconductor memory device described in Embodiment 6 can be used.

In the CPU illustrated in FIG. 16A, the register controller 1197 selects operation of retaining data in the register 1196 in accordance with an instruction from the ALU 1191. That is, the register controller 1197 selects whether data is retained by a flip-flop or a capacitor in the memory element included in the register 1196. When data is retained by the flip-flop, a power supply voltage is supplied to the memory element in the register 1196. When data is retained by the capacitor, the data in the capacitor is rewritten, and supply of the power supply voltage to the memory element in the register 1196 can be stopped.

Figure 16B:
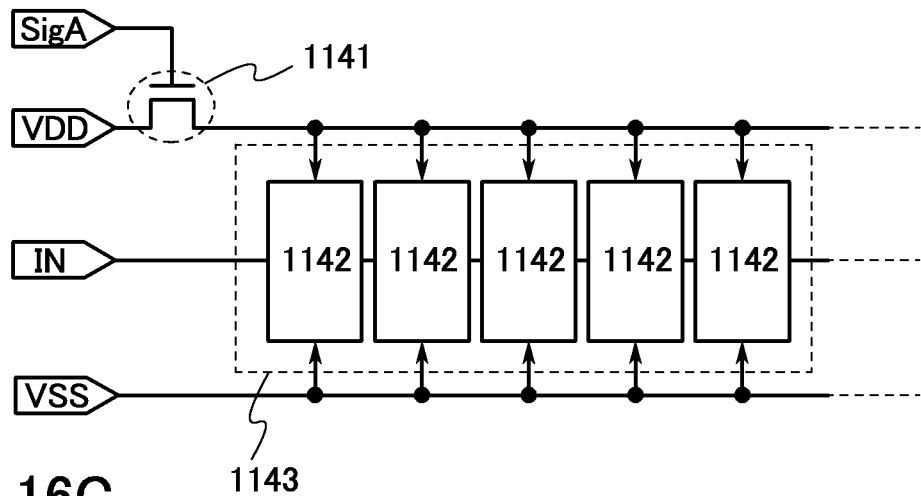
FIGS. 16B and 16C are circuit diagrams each illustrating part of the CPU.
Figure 16C:
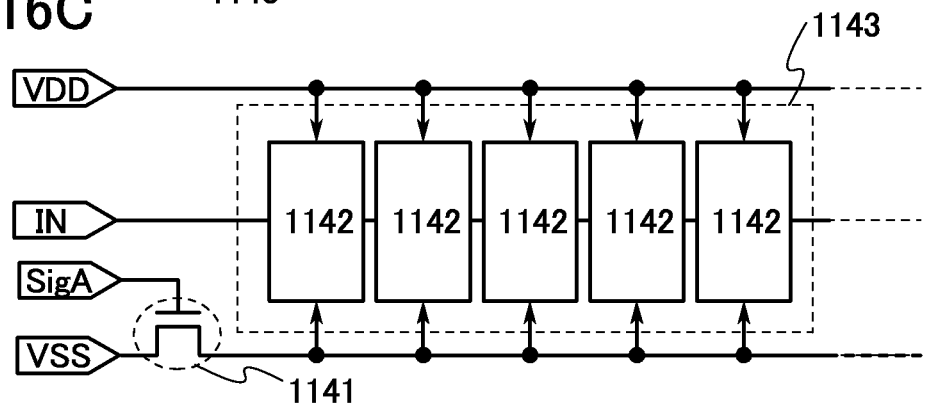

A switching element provided between a memory element group and a node to which a power supply potential VDD or a power supply potential VSS is supplied, as illustrated in FIG. 16B or FIG. 16C, allows the power supply voltage to be stopped. Circuits illustrated in FIGS. 16B and 16C will be described below.

FIGS. 16B and 16C each illustrate an example of a structure including the transistor described in any of Embodiments 1 to 4 as a switching element for controlling supply of a power supply voltage to a memory element.

The memory device illustrated in FIG. 16B includes a switching element 1141 and a memory element group 1143 including a plurality of memory elements 1142. Specifically, as each of the memory elements 1142, the semiconductor memory device described in Embodiment 6 can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and a potential of the low-level power supply potential VSS.

In FIG. 16B, the transistor described in any of Embodiments 1 to 4 is used as the switching element 1141, and the switching of the transistor is controlled by a signal SigA supplied to a gate thereof.

Note that FIG. 16B illustrates the structure in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

In FIG. 16C, an example of a memory device in which each of the memory elements 1142 included in the memory element group 1143 is supplied with the low-level power supply potential VSS through the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, one embodiment of the present invention can also be applied to an LSI such as a digital signal processor (DSP), a custom LS, or a field programmable gate array (FPGA).

This embodiment can be implemented by being combined as appropriate with any of the above-described embodiments.

Embodiment 8

In this embodiment, examples of electronic devices to which any of Embodiments 1 to 7 is applied will be described.

Figure 17A:
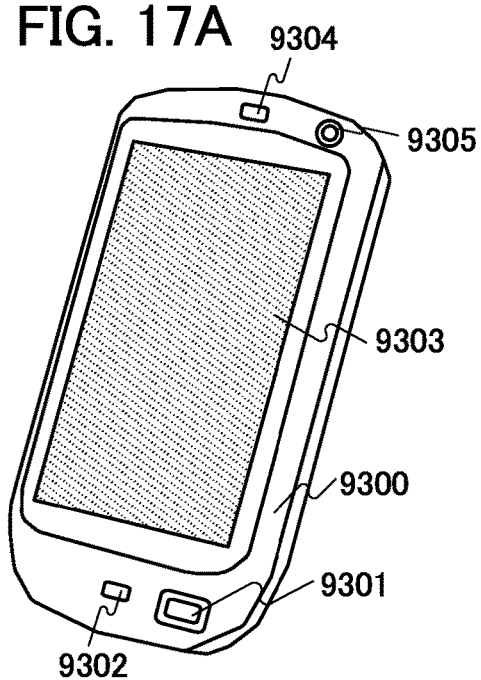
FIGS. 17A to 17D are perspective views each illustrating an example of an electronic device including a semiconductor device according to one embodiment of the present invention.

FIG. 17A illustrates a portable information terminal. The portable information terminal illustrated in FIG. 17A includes a housing 9300, a button 9301, a microphone 9302, a display portion 9303, a speaker 9304, and a camera 9305, and has a function as a mobile phone. One embodiment of the present invention can be applied to the display portion 9303 and the camera 9305. Although not illustrated, one embodiment of the present invention can be applied to an arithmetic device, a wireless circuit, or a memory circuit in a main body.

Figure 17B:
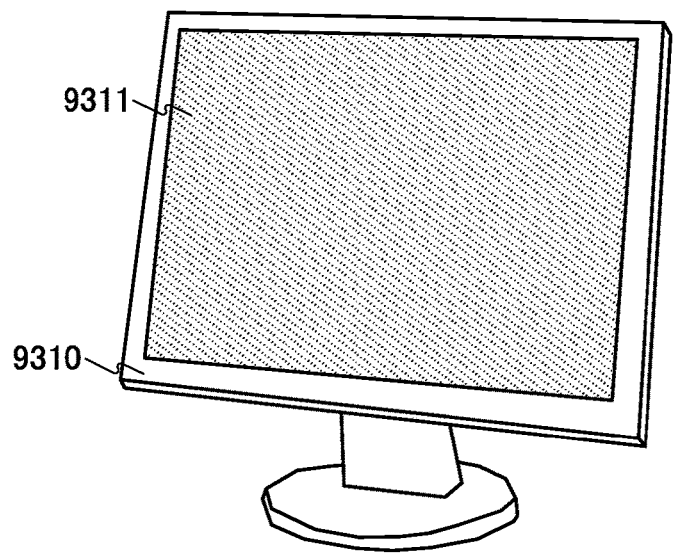

FIG. 17B illustrates a display. The display illustrated in FIG. 17B includes a housing 9310 and a display portion 9311. One embodiment of the present invention can be applied to the display portion 9311. By application of one embodiment of the present invention, a highly reliable display with high display quality and low power consumption can be provided.

Figure 17C:
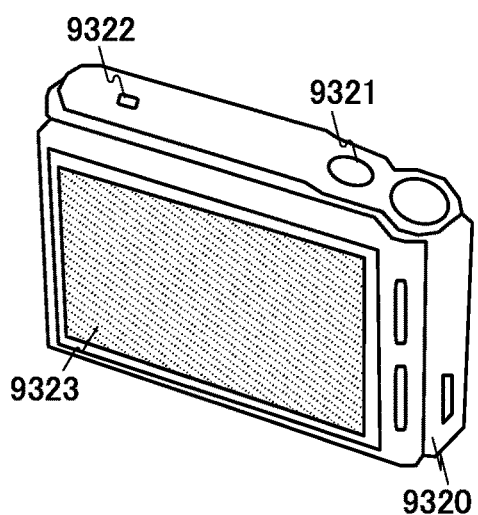

FIG. 17C illustrates a digital still camera. The digital still camera illustrated in FIG. 17C includes a housing 9320, a button 9321, a microphone 9322, and a display portion 9323. One embodiment of the present invention can be applied to the display portion 9323. Although not illustrated, one embodiment of the present invention can also be applied to a memory circuit or an image sensor.

Figure 17D:
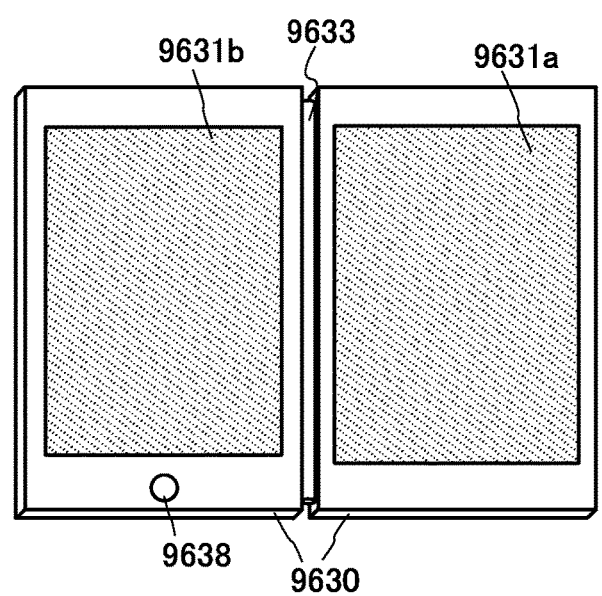

FIG. 17D illustrates a double-foldable portable information terminal. The double-foldable portable information terminal illustrated in FIG. 17D includes a housing 9630, a display portion 9631a, a display portion 9631b, a hinge 9633, and an operation switch 9638. One embodiment of the present invention can be applied to the display portion 9631a and the display portion 9631b. Although not illustrated, one embodiment of the present invention can be applied to an arithmetic device, a wireless circuit, or a memory circuit in a main body.

Part or whole of the display portion 963a and/or the display portion 9631b can function as a touch panel. By touching an operation key displayed on the touch panel, a user can input data, for example.

With use of a semiconductor device according to one embodiment of the present invention, the performance of an electronic device can be improved and the reliability of the electronic device can be improved.

This embodiment can be combined with any of the other embodiments as appropriate.

Example 1

In this example, behavior of oxygen in a silicon oxide film by heat treatment is described using secondary ion mass spectrometry (SIMS).

SIMS analysis was performed by using a PHI ADEPT-1010 quadrupole SIMS instrument manufactured by ULVAC-PHI, Inc.

A method for forming samples is described below.

First, a quartz substrate was prepared, and a silicon oxide film was deposited using $^{18}O_2$ over the quartz substrate. The silicon oxide film was deposited by a sputtering method. Specifically, the silicon oxide film was deposited to a thickness of 300 nm under the following conditions: a silicon oxide target was used, the atmosphere included argon with a flow rate of 25 sccm and oxygen ($^{18}O_2$) with a flow rate of 25 sccm, the pressure was controlled to be 0.4 Pa, the substrate heating temperature at the time of the deposition was 100° C., and the deposition power was 1.5 kW (13.56 MHz).

Here, $^{18}O_2$ is an oxygen molecule which includes an isotope ($^{18}O$) of an oxygen atom with an atomic weight of 18.

Next, a silicon oxide film was deposited over the silicon oxide film using $^{18}O_2$. Note that the silicon oxide film was deposited by a sputtering method. Specifically, the silicon oxide film was deposited to a thickness of 100 nm under the following conditions: a silicon oxide target was used, the atmosphere included argon with a flow rate of 25 sccm and oxygen with a flow rate of 25 sccm, the pressure was controlled to be 0.4 Pa, the substrate heating temperature at the time of the deposition was 100° C., and the deposition power was 1.5 kW (13.56 MHz). The silicon oxide film did not include $^{18}O$ intentionally.

Heat treatment for an hour at 150° C., 250° C., 350° C., and 550° C. was performed on the samples manufactured in such a manner, in a nitrogen atmosphere. Further, a sample on which heat treatment was not performed was prepared (called as-depo).

Figure 18:
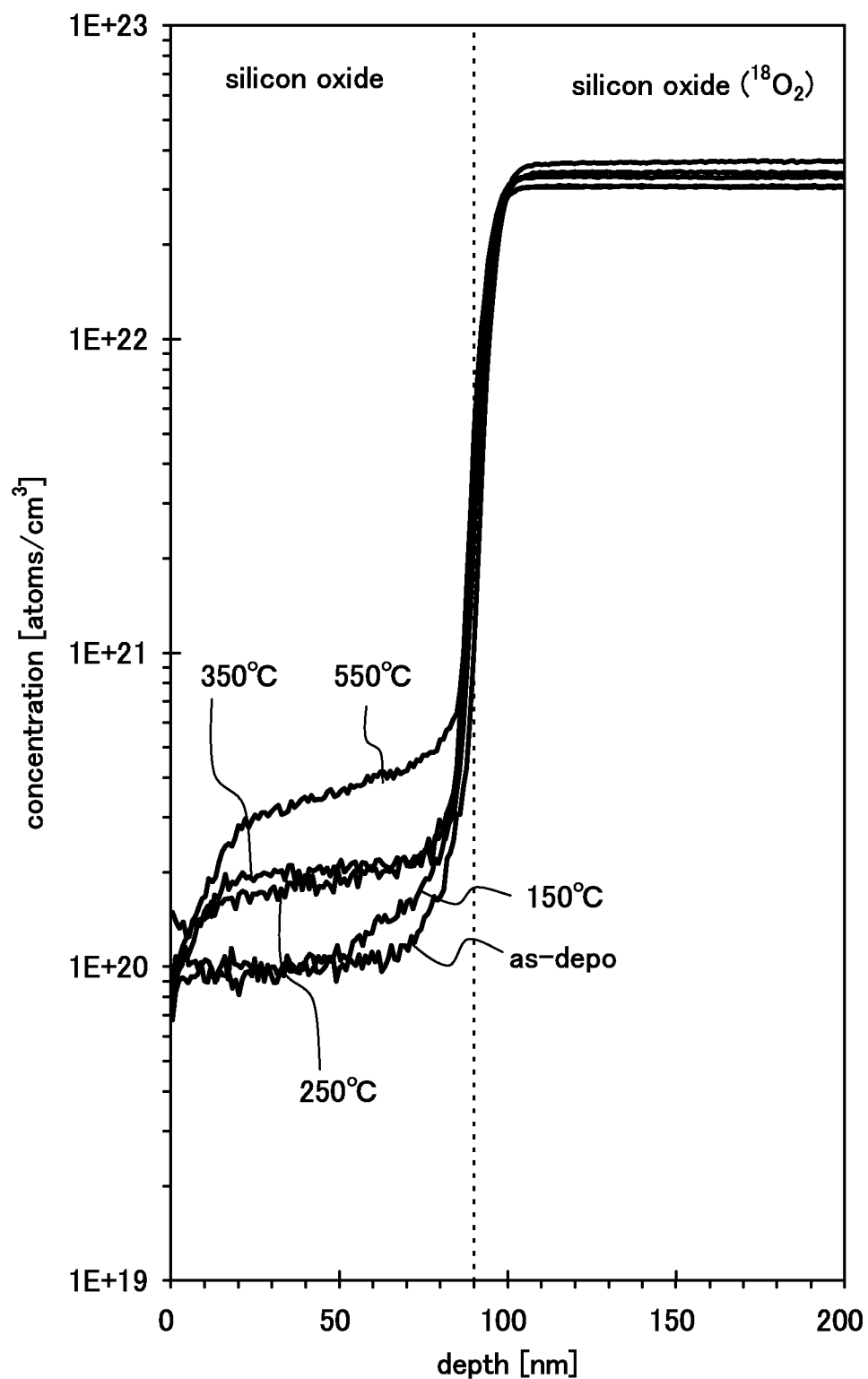
FIG. 18 shows diffusion of oxygen in a silicon oxide film.

FIG. 18 shows analysis results of $^{18}O$ in the depth direction by SIMS. In FIG. 18, "as-depo", "150° C.", "250° C.", "350° C.", and "550° C." represent the conditions of the heat treatment. The right side of a dashed line in FIG. 18 shows the silicon oxide film (referred to as silicon oxide ($^{18}O_2$)) deposited using $^{18}O_2$.

From FIG. 18, it was found that $^{18}O$ is diffused from the silicon oxide film deposited using $^{18}O_2$ to the silicon oxide film by the heat treatment. Further, it was found that as the temperature of the heat treatment is higher, the amount of $^{18}O$ diffused from the silicon oxide film deposited using $^{18}O_2$ to the silicon oxide film is increased.

As a result, oxygen is diffused into the silicon oxide film at a depth of approximately 40 nm, even by heat treatment at approximately 150° C.

This example shows that oxygen is diffused into a silicon oxide film by heat treatment.

Example 2

In this example, an oxygen-transmitting property of an aluminum oxide film is described using TDS analysis.

For the evaluation of release of gas, a thermal desorption spectroscopy apparatus manufactured by ESCO Ltd., EMD-WA1000S/W was used.

A method for forming samples is described below.

First, a silicon wafer was prepared and a thermal oxidation film was deposited over the silicon wafer. The thermal oxidation film was deposited to a thickness of 100 nm at 950° C. in an oxygen atmosphere containing HCl at 3%.

Next, a silicon oxide film was deposited over the thermal oxidation film.

The silicon oxide film was deposited by a sputtering method. Specifically, the silicon oxide film was formed to a thickness of 300 nm under the following conditions: a silicon oxide target was used, the atmosphere included oxygen with a flow rate of 50 sccm, the pressure was controlled to be 0.4 Pa, the substrate heating temperature at the time of the deposition was 100° C., and the deposition power was 2 kW (13.56 MHz). A sample formed in the above manner was used as Sample A.

Next, an aluminum oxide film was deposited over the silicon oxide film.

The aluminum oxide film was deposited by a sputtering method. Specifically, the aluminum oxide film was deposited to a thickness of 10 nm under the following conditions: an aluminum oxide target was used, the atmosphere included argon with a flow rate of 25 sccm and oxygen with a flow rate of 25 sccm, the pressure was controlled to be 0.4 Pa, the substrate heating temperature at the time of the deposition was 250° C., and the deposition power was 2.5 kW (13.56 MHz). A sample formed in the above manner was used as Sample B.

Sample A and Sample B were formed in the above manner. Next, desorption of a gas from each sample was evaluated.

Figure 19A:
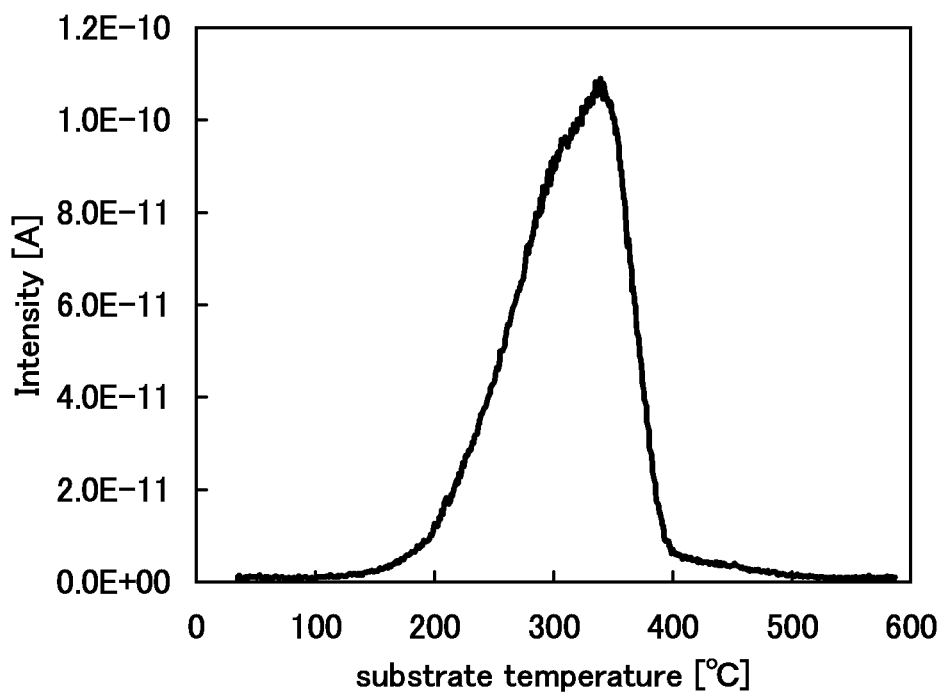
FIGS. 19A and 19B show an oxygen-transmitting property of an aluminum oxide film.
Figure 19B:
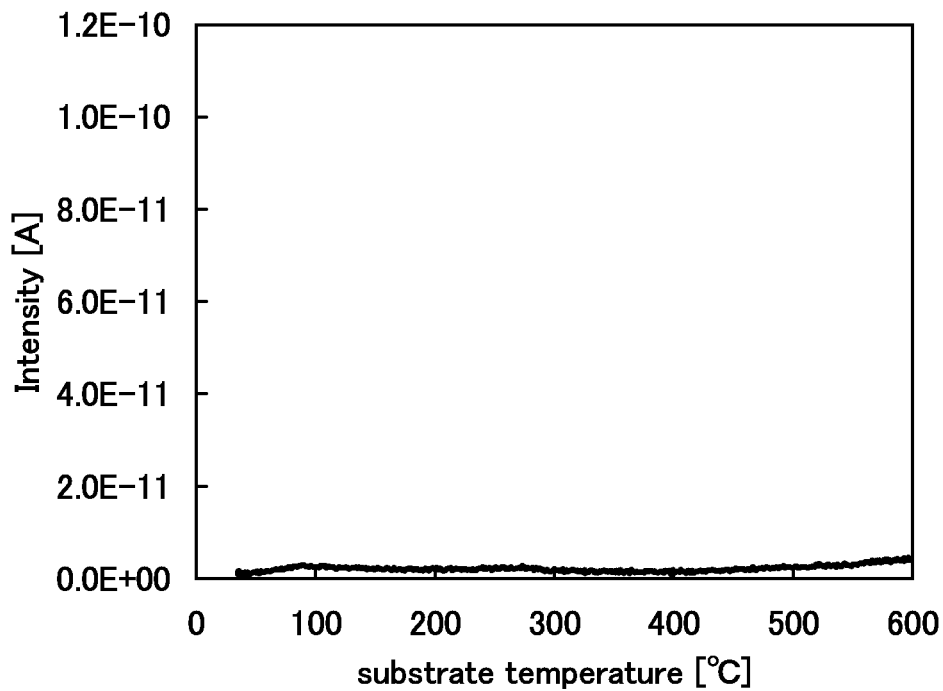

FIGS. 19A and 19B show ion intensity of a gas at M/z=32, which was obtained by TDS analysis. Here, FIG. 19A shows the ion intensity, obtained by TDS analysis, of the gas at M/z=32 of Sample A in which the aluminum oxide film was not provided over the silicon oxide film. FIG. 19B shows the ion intensity, obtained by TDS analysis, of the gas at M/z=32 of Sample B in which the aluminum oxide film was provided over the silicon oxide film.

By TDS analysis of Sample A shown in FIG. 19A, it was found that the gas at M/z=32 was desorbed when the substrate temperature was higher than or equal to 200° C. and lower than or equal to 400° C. Note that when converted into the number of oxygen atoms, the released amount was $5.0 \times 10^2$ atoms/cm$^3$.

By TDS analysis of Sample B shown in FIG. 19B, it was found that the gas at M/z=32 was hardly desorbed when the substrate temperature was higher than or equal to 200° C. and lower than or equal to 400° C.

By comparison of Sample A and Sample B, it was found that provision of an aluminum oxide film with a thickness of 10 nm over a silicon oxide film which releases oxygen by heat treatment can prevent outward diffusion of oxygen that is released from the silicon oxide film.

This example shows that an aluminum oxide film has a low oxygen-transmitting property.

Example 3

In this example, an oxygen-transmitting property of an yttria-stabilized zirconia (also referred to as YSZ; zirconium oxide to which yttrium oxide is added) film is described using TDS analysis.

For the evaluation of release of gas, a thermal desorption spectroscopy apparatus manufactured by ESCO Ltd., EMD-WA1000S/W was used.

A method for forming a sample is described below.

First, a silicon wafer was prepared and a silicon oxide film was deposited over the silicon wafer.

The silicon oxide film was deposited by a sputtering method. Specifically, the silicon oxide film was formed to a thickness of 300 nm under the following conditions: a silicon oxide target was used, the atmosphere included argon with a flow rate of 25 sccm and oxygen with a flow rate of 25 sccm, the pressure was controlled to be 0.4 Pa, the substrate heating temperature at the time of the deposition was 100° C., and the deposition power was 1.5 kW (13.56 MHz).

Next, a YSZ film was deposited over the silicon oxide film.

The YSZ film was deposited by a sputtering method. Specifically, the YSZ film was deposited to a thickness of 10 nm under the following conditions: a YSZ target (zirconium oxide:yttrium oxide=92:8 [molar ratio]) was used, the atmosphere included argon with a flow rate of 20 sccm and oxygen with a flow rate of 20 sccm, the pressure was controlled to be 0.4 Pa, the substrate heating temperature at the time of the deposition was room temperature, and the deposition power was 250 W (13.56 MHz).

In such a manner, the sample was manufactured. Next, desorption of a gas from the sample was evaluated.

Figure 20:
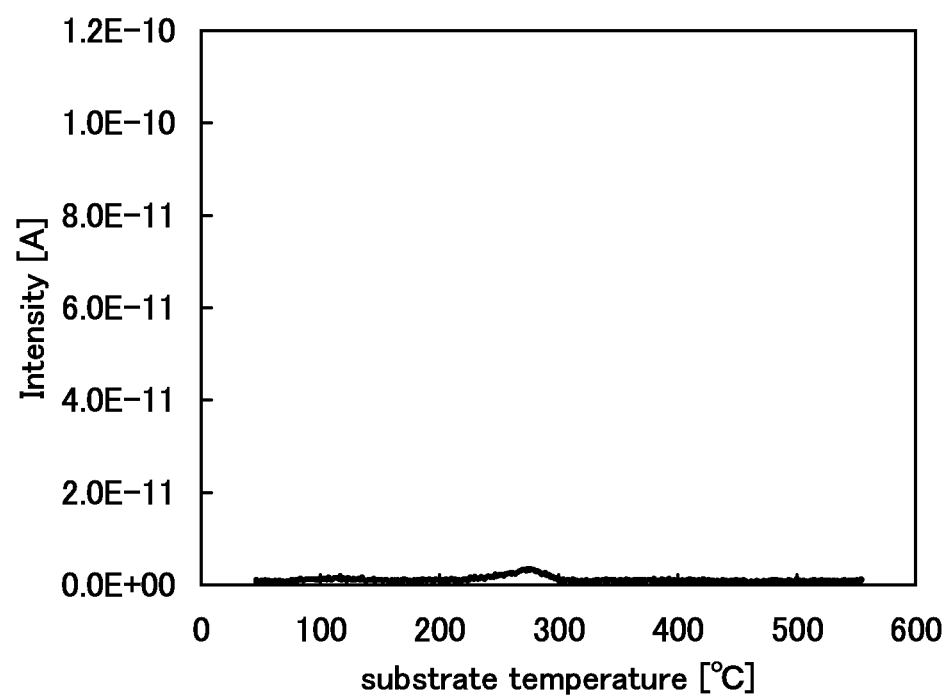
FIG. 20 shows an oxygen-transmitting property of a YSZ film.

FIG. 20 shows ion intensity of a gas at M/z=32, which was obtained by TDS analysis.

By TDS analysis of the sample shown in FIG. 20, it was found that the gas at M/z=32 was hardly desorbed when the substrate temperature was higher than or equal to 200° C. and lower than or equal to 400° C.

Thus, provision of a YSZ film with a thickness of 10 nm over a silicon oxide film can prevent outward diffusion of oxygen that is released from the silicon oxide film.

This example shows that a YSZ film has a low oxygen-transmitting property.

This application is based on Japanese Patent Application serial no. 2011-257487 filed with Japan Patent Office on Nov. 25, 2011, the entire contents of which are hereby incorporated by reference.

What is claimed is:
1. A semiconductor device comprising:
a gate electrode; and
an oxide semiconductor film overlapping with the gate electrode with a gate insulating film therebetween,
wherein the gate electrode comprises:
a first layer in contact with the gate insulating film;
a second layer under the first layer; and
a third layer under the second layer,
wherein the first layer and the third layer overlap with each other with the second layer provided therebetween,
wherein the first layer is in direct contact with a top surface and side surfaces of the second layer,
wherein each of the first layer and the second layer comprises a first metal element and oxygen,
wherein the first layer has an oxygen concentration lower than that of the second layer,
wherein the third layer has a conductivity higher than that of each of the first layer and the second layer, and
wherein the oxide semiconductor film comprises In, Zn, and Ga.
2. The semiconductor device according to claim 1, wherein the first metal element is selected from silver, copper, ruthenium, iridium, platinum, and gold.
3. The semiconductor device according to claim 1, wherein a density of the gate insulating film is lower than 3.2 g/cm$^3$.
4. The semiconductor device according to claim 1, wherein the gate insulating film comprises a layer, and wherein the layer comprises one of aluminum oxide, magnesium oxide, silicon oxide, silicon oxynitride, germanium oxide, yttrium oxide, zirconium oxide, lanthanum oxide, neodymium oxide, hafnium oxide, and tantalum oxide.
5. The semiconductor device according to claim 1, wherein the gate insulating film has an oxygen-transmitting property, and
wherein the gate electrode is configured to supply oxygen included in the gate electrode to the oxide semiconductor film through the gate insulating film.
6. The semiconductor device according to claim 1, wherein the first layer and the second layer are more hardly oxidized than the gate insulating film.
7. The semiconductor device according to claim 1, wherein a work function of the first layer is greater than 5 eV.

8. A semiconductor device comprising:
a gate electrode; and
an oxide semiconductor film overlapping with the gate electrode with a gate insulating film therebetween,
wherein the gate electrode comprises:
   a first layer in contact with the gate insulating film;
   a second layer under the first layer; and
   a third layer under the second layer,
   wherein the first layer and the third layer overlap with each other with the second layer provided therebetween,
   wherein the first layer is in direct contact with a top surface and side surfaces of the second layer,
   wherein each of the first layer and the second layer comprises a first metal element and oxygen,
   wherein the first layer has an oxygen concentration lower than that of the second layer,
   wherein the third layer has a conductivity higher than that of each of the first layer and the second layer,
   wherein the first layer has a Gibbs free energy for oxidation higher than that of the gate insulating film, and
wherein the oxide semiconductor film comprises In, Zn, and Ga.

9. The semiconductor device according to claim 8,
wherein the first layer comprises a region being in direct contact with a part of a top surface of the third layer.

10. The semiconductor device according to claim 8,
wherein the first metal element is selected from the group consisting of silver, copper, ruthenium, iridium, platinum, and gold.

11. The semiconductor device according to claim 8,
wherein a density of the gate insulating film is lower than 3.2 g/cm$^3$.

12. The semiconductor device according to claim 8,
wherein the gate insulating film comprises a layer, and
wherein the layer comprises one of aluminum oxide, magnesium oxide, silicon oxide, silicon oxynitride, germanium oxide, yttrium oxide, zirconium oxide, lanthanum oxide, neodymium oxide, hafnium oxide, and tantalum oxide.

13. The semiconductor device according to claim 8,
wherein the gate insulating film has an oxygen-transmitting property, and
wherein the gate electrode is configured to supply oxygen included in the gate electrode to the oxide semiconductor film through the gate insulating film.

14. The semiconductor device according to claim 8,
wherein the first layer and the second layer are more hardly oxidized than the gate insulating film.

15. The semiconductor device according to claim 8,
wherein a work function of the first layer is greater than 5 eV.

16. A semiconductor device comprising:
a gate electrode; and
an oxide semiconductor film overlapping with the gate electrode with a gate insulating film therebetween,
wherein the gate electrode comprises:
   a first layer in contact with the gate insulating film;
   a second layer under the first layer; and
   a third layer under the second layer,
   wherein the first layer and the third layer overlap with each other with the second layer provided therebetween,
   wherein the first layer is in direct contact with a top surface and side surfaces of the second layer and a part of a top surface of the third layer,
   wherein each of the first layer and the second layer comprises an oxide of a first metal element,
   wherein the first layer has an oxygen concentration lower than that of the second layer,
   wherein the third layer has a conductivity higher than that of each of the first layer and the second layer, and
wherein the oxide semiconductor film comprises In, Zn, and Ga.

17. The semiconductor device according to claim 16,
wherein the first metal element is at least one selected from silver, copper, ruthenium, iridium, platinum, and gold.

18. The semiconductor device according to claim 16,
wherein a density of the gate insulating film is lower than 3.2 g/cm$^3$.

19. The semiconductor device according to claim 16,
wherein the gate insulating film comprises a layer, and
wherein the layer comprises one of aluminum oxide, magnesium oxide, silicon oxide, silicon oxynitride, germanium oxide, yttrium oxide, zirconium oxide, lanthanum oxide, neodymium oxide, hafnium oxide, and tantalum oxide.

20. The semiconductor device according to claim 16,
wherein the gate insulating film has an oxygen-transmitting property, and
wherein the gate electrode is configured to supply oxygen included in the gate electrode to the oxide semiconductor film through the gate insulating film.

21. The semiconductor device according to claim 16,
wherein the first layer and the second layer are more hardly oxidized than the gate insulating film.

22. The semiconductor device according to claim 16,
wherein a work function of the first layer is greater than 5 eV.

* * * * *